United States Patent
Heo et al.

(10) Patent No.: US 9,887,303 B2
(45) Date of Patent: Feb. 6, 2018

(54) SEMICONDUCTOR DEVICE INCLUDING TWO-DIMENSIONAL MATERIAL, AND METHOD OF MANUFACTURING THE SEMICONDUCTOR DEVICE

(71) Applicant: Samsung Electronics Co., Ltd., Suwon-si, Gyeonggi-do (KR)

(72) Inventors: Jinseong Heo, Seoul (KR); Kiyoung Lee, Seoul (KR); Sangyeob Lee, Hwaseong-si (KR); Eunkyu Lee, Yongin-si (KR); Jaeho Lee, Seoul (KR); Seongjun Park, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/971,019

(22) Filed: Dec. 16, 2015

(65) Prior Publication Data
US 2016/0343891 A1 Nov. 24, 2016

(30) Foreign Application Priority Data

May 18, 2015 (KR) ........................ 10-2015-0069119

(51) Int. Cl.
*H01L 31/00* (2006.01)
*H01L 31/032* (2006.01)
(Continued)

(52) U.S. Cl.
CPC ........ *H01L 31/032* (2013.01); *H01L 27/1446* (2013.01); *H01L 29/127* (2013.01);
(Continued)

(58) Field of Classification Search
CPC ................... H01L 29/1606; H01L 31/035227
See application file for complete search history.

(56) References Cited

U.S. PATENT DOCUMENTS 7,968,013 B2 6/2011 Choi et al.
8,507,890 B1 8/2013 Koppens et al.
(Continued)

FOREIGN PATENT DOCUMENTS

KR 20140045841 A 4/2014
KR 20140091812 A 7/2014
(Continued)

OTHER PUBLICATIONS

Woo Jong Yu, "Highly efficient gate-tunable photocurrent generation in vertical heterostructures of layered materials", Nature Nanotechnology, Supplementary Information, Macmillan Publishers Limited, 2013, pp. 1-5.
(Continued)

*Primary Examiner* — Ngan Ngo
(74) *Attorney, Agent, or Firm* — Harness, Dickey & Pierce, P.L.C.

(57) ABSTRACT

Example embodiments relate to semiconductor devices including two-dimensional (2D) materials, and methods of manufacturing the semiconductor devices. A semiconductor device may be an optoelectronic device including at least one doped 2D material. The optoelectronic device may include a first electrode, a second electrode, and a semiconductor layer between the first and second electrodes. At least one of the first electrode and the second electrode may include doped graphene. The semiconductor layer may have a built-in potential greater than or equal to about 0.1 eV, or greater than or equal to about 0.3 eV. One of the first electrode and the second electrode may include p-doped graphene, and the other may include n-doped graphene. Alternatively, one of the first electrode and the second electrode may include p-doped or n-doped graphene, and the other may include a metallic material.

25 Claims, 50 Drawing Sheets

(51) Int. Cl.
  H01L 29/16    (2006.01)
  H01L 31/0352  (2006.01)
  H01L 31/0224  (2006.01)
  H01L 31/18    (2006.01)
  H01L 27/144   (2006.01)
  H01L 29/12    (2006.01)
  H01L 29/24    (2006.01)
  H01L 29/45    (2006.01)
  H01L 29/66    (2006.01)
  H01L 29/786   (2006.01)

(52) U.S. Cl.
  CPC .......... *H01L 29/1606* (2013.01); *H01L 29/24* (2013.01); *H01L 29/45* (2013.01); *H01L 29/66977* (2013.01); *H01L 29/786* (2013.01); *H01L 31/022408* (2013.01); *H01L 31/022425* (2013.01); *H01L 31/022466* (2013.01); *H01L 31/035209* (2013.01); *H01L 31/035218* (2013.01); *H01L 31/035227* (2013.01); *H01L 31/035281* (2013.01); *H01L 31/1884* (2013.01); *Y02E 10/50* (2013.01)

(56) References Cited

U.S. PATENT DOCUMENTS

| | | | |
|---|---|---|---|
| 9,472,723 B2* | 10/2016 | Bulovic | H01L 33/36 |
| 2009/0146111 A1 | 6/2009 | Shin et al. | |
| 2010/0133480 A1 | 6/2010 | Shin et al. | |
| 2012/0160312 A1* | 6/2012 | Arakawa | B82Y 20/00 |
| | | | 136/255 |
| 2012/0261669 A1* | 10/2012 | Wang | G02B 6/42 |
| | | | 257/66 |
| 2013/0001516 A1* | 1/2013 | Hebard | H01L 29/1606 |
| | | | 257/29 |
| 2013/0082241 A1* | 4/2013 | Kub | H01L 27/148 |
| | | | 257/21 |
| 2014/0020739 A1 | 1/2014 | Yang et al. | |
| 2014/0097403 A1 | 4/2014 | Heo et al. | |
| 2014/0147951 A1* | 5/2014 | Bulovic | H01L 33/005 |
| | | | 438/46 |
| 2014/0182668 A1* | 7/2014 | Pacifici | H01L 31/035218 |
| | | | 136/255 |
| 2014/0264275 A1 | 9/2014 | Zhong et al. | |
| 2014/0335650 A1 | 11/2014 | Avouris et al. | |
| 2015/0008770 A1 | 1/2015 | Fubuki | |
| 2015/0014630 A1* | 1/2015 | Choi | H01L 29/1606 |
| | | | 257/24 |
| 2015/0083206 A1* | 3/2015 | Novoselov | B82Y 30/00 |
| | | | 136/256 |
| 2015/0318119 A1* | 11/2015 | McDaniel | H01G 9/2031 |
| | | | 136/254 |
| 2015/0357485 A1* | 12/2015 | Choi | H01L 31/028 |
| | | | 257/29 |
| 2016/0020280 A1 | 1/2016 | Heo et al. | |
| 2016/0276507 A1* | 9/2016 | Kanakura | H01L 31/035218 |
| 2016/0284811 A1* | 9/2016 | Yu | H01L 29/454 |
| 2016/0300879 A1* | 10/2016 | Harada | H01L 27/14647 |

FOREIGN PATENT DOCUMENTS

| | | | |
|---|---|---|---|
| WO | WO-2014100723 A1 | 6/2014 | |
| WO | WO 2014109444 A1 * | 7/2014 | .......... H01L 31/028 |

OTHER PUBLICATIONS

L. Britnell, "Strong Light-Matter Interactions in Heterostructures of Atomically Thin Films", Science Express, May 2, 2013, pp. 1-12.
Wi, Sungjin, et al. "High blue-near ultraviolet photodiode response of vertically stacked graphene-MoS$_2$-metal heterostructures," Applied Physics Letters, 2014, vol. 104, pp. 232103-1-232103-5.
European Search Report dated Oct. 19, 2016 for corresponding European Patent Application No. 16159860.2.

* cited by examiner

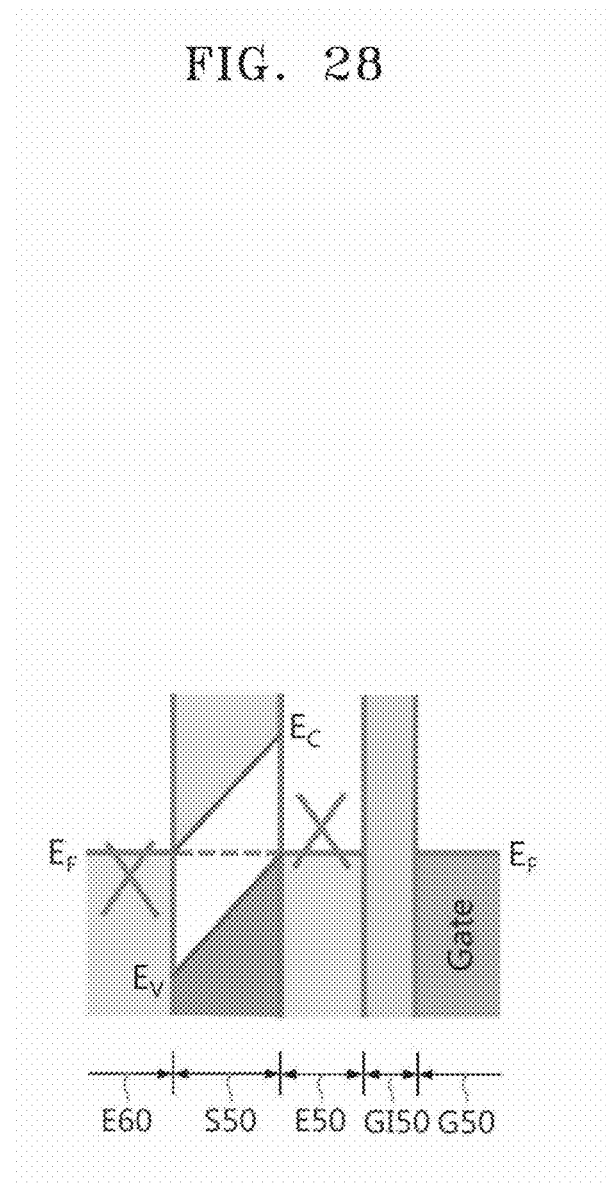

SEMICONDUCTOR DEVICE INCLUDING TWO-DIMENSIONAL MATERIAL, AND METHOD OF MANUFACTURING THE SEMICONDUCTOR DEVICE

CROSS-REFERENCE TO RELATED APPLICATIONS

This application claims the benefit of priority from Korean Patent Application No. 10-2015-0069119, filed on May 18, 2015, in the Korean Intellectual Property Office, the disclosure of which is incorporated herein in its entirety by reference.

BACKGROUND

1. Field

Example embodiments relate to semiconductor devices and/or methods of manufacturing the same, and more particularly, to semiconductor devices including two-dimensional (2D) materials and/or methods of manufacturing the semiconductor devices.

2. Description of the Related Art

A two-dimensional (2D) material is a single-layer or half-layer solid material in which atoms form a crystal structure. The most well-known example of a 2D material is graphene. Graphene is a single-layer (e.g., single atomic layer) structure in which carbon atoms form a hexagonal structure. Graphene may have a band structure that is symmetrical around the Dirac point, and the effective mass of a charge at the Dirac point is substantially small. Therefore, graphene may have a charge mobility that is at least 10 times or higher (may be even 1000 times or higher) the charge mobility of silicon (Si). Furthermore, graphene may have a high Fermi velocity ($V_F$). Therefore, 2D materials, including graphene, have drawn attention as next-generation materials that may overcome limits of materials in the related art.

Attempts to apply a 2D material to various semiconductor devices have been conducted. However, when applying a 2D material to semiconductor devices, various technical problems may be generated, and it may be difficult to secure good properties/performance.

SUMMARY

Example embodiments relate to high-performance semiconductor devices (e.g., optoelectronic devices or transistors) including a two-dimensional (2D) material.

Example embodiments relate to semiconductor devices having a controlled energy band structure.

Example embodiments relate to optoelectronic devices configured to exhibit good photoelectric conversion properties even when no external voltage is applied.

Example embodiments relate to transistors that may be operated with low power and have excellent operational characteristics.

Example embodiments relate to methods of manufacturing the semiconductor devices (e.g., optoelectronic devices or transistors).

Additional example embodiments will be set forth in part in the description which follows and, in part, will be apparent from the description, or may be learned by practice of the example embodiments.

According to various example embodiments, an optoelectronic device includes a first electrode, a second electrode spaced apart from the first electrode, and a semiconductor active layer between the first and second electrodes, wherein at least one of the first electrode and the second electrode includes doped graphene, and wherein the semiconductor active layer has a built-in potential of substantially 0.1 eV or greater. In one example embodiment, the semiconductor active layer having a built-in potential of substantially 0.1 eV or greater is an enhanced semiconductor active layer.

One of the first electrode and the second electrode may include graphene doped with a p-type dopant, and the other of the first electrode and the second electrode may include graphene doped with an n-type dopant.

One of the first electrode and the second electrode may include graphene doped with a p-type dopant or an n-type dopant, and the other of the first electrode and the second electrode may include a metallic material.

A difference between work functions of the doped graphene and the metallic material may be about 0.1 to 5 eV.

A built-in electric field of the semiconductor active layer may be about 0.3 to 100 MV/cm.

The semiconductor active layer may include a first region that is adjacent to the first electrode, a second region that is adjacent to the second electrode, and at least one of the first region and the second region may be a doped region.

When the first electrode is doped with a dopant of a first type, the first region of the semiconductor active layer may be doped with a dopant of the same type as the first type.

When the second electrode is doped with a dopant of a second type, the second region of the semiconductor active layer may be doped with a dopant of the same type as the second type.

The first and second regions of the semiconductor active layer may be spaced apart from each other or may contact each other.

The semiconductor active layer may include a two-dimensional (2D) semiconductor having a 2D crystal structure.

The 2D semiconductor may include a metal chalcogenide-based material.

The metal chalcogenide-based material may include a metal element from Mo, W, Nb, V, Ta, Ti, Zr, Hf, Tc, Re, Cu, Ga, In, Sn, Ge, and Pb, and a chalcogen element from S, Se, and Te.

The semiconductor active layer may include a quantum dot.

Most or all of the first electrode, the second electrode, and the semiconductor active layer may include 2D materials.

The built-in potential of the semiconductor active layer may be less than or equal to about 5 eV.

The optoelectronic device may be a photodetector or a photovoltaic device.

The photodetector may be a self-powered photodetector.

The optoelectronic device may further include a first contact electrode that contacts the first electrode, and a second contact electrode that contacts the second electrode.

The first contact electrode and the second contact electrode may be spaced apart from each other in a horizontal direction.

The first contact electrode and the second contact electrode may be spaced apart from each other in a vertical direction.

The first electrode may extend from the semiconductor active layer in a first direction, and the second electrode may extend from the semiconductor active layer in a second direction opposite the first direction.

The first electrode may extend from the semiconductor active layer in a first direction, and the second electrode may extend from the semiconductor active layer in a second direction perpendicular to the first direction.

The first electrode, the second electrode, and the semiconductor active layer may constitute a unit cell, and the optoelectronic device may include a plurality of unit cells.

The optoelectronic device may further include a plurality of first contact electrodes respectively connected to first ends of the plurality of unit cells, and a second contact electrode commonly connected to second ends of the plurality of unit cells.

According to at least one example embodiment, an optoelectronic device includes a first electrode, a second electrode spaced apart from the first electrode, and a semiconductor active layer interposed between the first and second electrodes and including at least one of a 2D semiconductor and a quantum dot, wherein the semiconductor active layer has a built-in potential of substantially 0.1 eV or greater between the first and second electrodes.

At least one of the first electrode and the second electrode may include doped graphene.

One of the first electrode and the second electrode may include graphene doped with a p-type dopant, and the other of the first electrode and the second electrode may include graphene doped with an n-type dopant.

One of the first electrode and the second electrode may include graphene doped with a p-type dopant or an n-type dopant, and the other of the first electrode and the second electrode may include a metallic material.

The semiconductor active layer may include a first region that is adjacent to the first electrode, and a second region that is adjacent to the second electrode, and at least one of the first region and the second region may be a doped region.

When the first electrode is doped with a dopant of a first type, the first region of the semiconductor active layer may be a region doped with a dopant of the same type as the first type.

When the second electrode is doped with a dopant of a second type, the second region of the semiconductor active layer may be a region doped with a dopant of the same type as the second type.

The 2D semiconductor may include a metal chalcogenide-based material.

The metal chalcogenide-based material may include a metal element from Mo, W, Nb, V, Ta, Ti, Zr, Hf, Tc, Re, Cu, Ga, In, Sn, Ge, and Pb, and a chalcogen element from S, Se, and Te.

According to at least one example embodiment, a transistor includes a source electrode, a drain electrode spaced apart from the source electrode, a semiconductor layer between the source electrode and the drain electrode, and a gate electrode for applying an electric field to the semiconductor layer, wherein at least one of the source electrode and the drain electrode includes doped graphene, and the semiconductor layer has a built-in potential of substantially 0.1 eV or greater.

One of the source electrode and the drain electrode may include graphene doped with a p-type dopant, and the other of the source electrode and the drain electrode may include graphene doped with an n-type dopant.

One of the source electrode and the drain electrode may include the doped graphene, and the other of the source electrode and the drain electrode may include a metallic material.

A difference between work functions of the doped graphene and the metallic material may be about 0.1 eV to about 5 eV.

A built-in electric field of the semiconductor layer may be about 0.3 MV/cm to 100 MV/cm.

The semiconductor layer may include a first region that is adjacent to the source electrode, and a second region that is adjacent to the drain electrode, and at least one of the first region and the second region may be a doped region.

When the source electrode is doped with a dopant of a first type, the first region of the semiconductor layer may be a region doped with a dopant of the same type as the first type.

When the drain electrode is doped with a dopant of a second type, the second region of the semiconductor layer may be a region doped with a dopant of the same type as the second type.

The semiconductor layer may include at least one of a 2D semiconductor and a quantum dot.

The 2D semiconductor may include a metal chalcogenide-based material.

The built-in potential of the semiconductor active layer may be less than or equal to about 5 eV.

The semiconductor layer may be a tunneling layer.

The transistor may be a tunneling transistor.

BRIEF DESCRIPTION OF THE DRAWINGS

These and/or other example embodiments will become apparent and more readily appreciated from the following description, taken in conjunction with the accompanying drawings in which:

FIG. 28 is an energy band diagram of the transistor of FIG. 27 when the transistor is in an equilibrium state;

DETAILED DESCRIPTION

Figure 1:
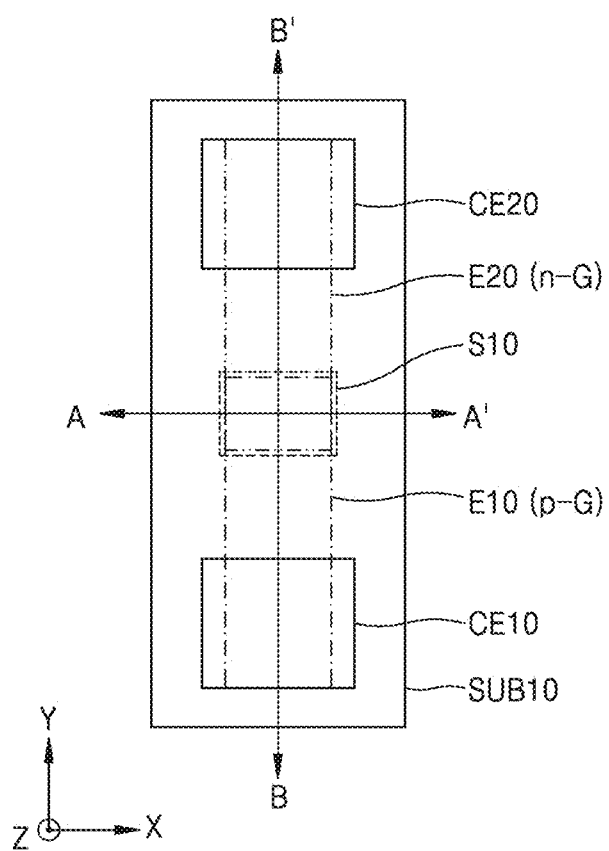
FIG. 1 is a plan view of an optoelectronic device according to at least one example embodiment.

Various example embodiments will now be described more fully with reference to the accompanying drawings in which the example embodiments are shown.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items. Further, it will be understood that when a layer is referred to as being "under" another layer, it can be directly under or one or more intervening layers may also be present. In addition, it will also be understood that when a layer is referred to as being "between" two layers, it can be the only layer between the two layers, or one or more intervening layers may also be present.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

In the drawing figures, the dimensions of layers and regions may be exaggerated for clarity of illustration. Like reference numerals refer to like elements throughout. The same reference numbers indicate the same components throughout the specification.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein. As used herein, expressions such as "at least one of," when preceding a list of elements, modify the entire list of elements and do not modify the individual elements of the list.

When the terms "about" or "substantially" are used in this specification in connection with a numerical value, it is intended that the associated numerical value include a tolerance of ±10% around the stated numerical value. Moreover, when reference is made to percentages in this specification, it is intended that those percentages are based on weight, i.e., weight percentages. The expression "up to" includes amounts of zero to the expressed upper limit and all values therebetween. When ranges are specified, the range includes all values therebetween such as increments of 0.1%. Moreover, when the words "generally" and "substantially" are used in connection with geometric shapes, it is intended that precision of the geometric shape is not required but that latitude for the shape is within the scope of the disclosure. Although the tubular elements of the example embodiments may be cylindrical, other tubular cross-sectional forms are contemplated, such as square, rectangular, oval, triangular and others.

Hereinafter, semiconductor devices including two-dimensional (2D) materials, and methods of manufacturing the semiconductor devices, according to example embodiments, will be described more fully with reference to the accompanying drawings. In the drawings, the widths and thicknesses of layers and regions are exaggerated for clarity. Like reference numerals in the drawings denote like elements.

Figure 2:
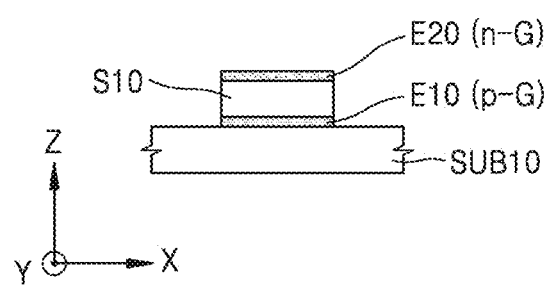
FIG. 2 is a sectional view taken along line A-A' in FIG. 1.
Figure 3:
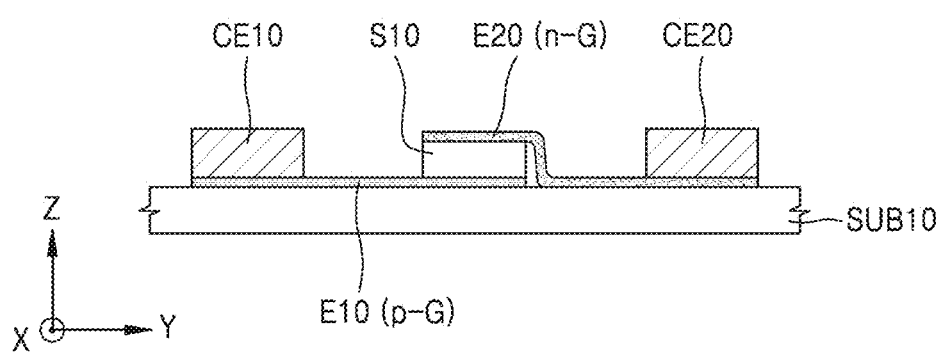
FIG. 3 is a sectional view taken along line B-B' in FIG. 1.

FIG. 1 is a plan view of an optoelectronic device according to an example embodiment. FIG. 2 is a sectional view taken along line A-A' in FIG. 1. FIG. 3 is a sectional view taken along line B-B' in FIG. 1.

Referring to FIGS. 1-3, the optoelectronic device may include a first electrode E10 and a second electrode E20, which are apart from each other, and a semiconductor active layer S10 disposed therebetween. The first electrode E10 may be formed on a substrate SUB10, the semiconductor active layer S10 may be formed on at least a portion of the first electrode E10, and the second electrode E20 may be formed to cover at least a portion of the semiconductor active layer S10 on the substrate SUB10. Thus, the first electrode E10, the semiconductor active layer S10, and the second electrode E20 may at least partially overlap each other in a vertical direction (i.e., a Z-axis direction). In this respect, the optoelectronic device may be deemed to include a vertically stacked structure. The substrate SUB10 may be, for example, a semiconductor substrate such as a silicon substrate. In this case, the substrate SUB10 may include an insulation layer (not shown), such as a silicon oxide layer, formed on a surface (i.e., upper surface) of the substrate SUB10. The first electrode E10, the semiconductor active layer S10, and the second electrode E20 may be formed on the insulation layer. However, a material of the substrate SUB10 may vary. Also, when the insulation layer is used, a material of the insulation layer may vary. The substrate SUB10 may be a flexible substrate or a rigid substrate, and may be a transparent, opaque, or semi-transparent substrate.

At least one of the first electrode E10 and the second electrode E20 may include a doped graphene layer. For example, one of the first and second electrodes E10 and E20 may include a graphene layer doped with a p-type dopant (i.e., a p-doped graphene layer; p-G), and the other of the first and second electrodes E10 and E20 may include a graphene layer doped with an n-type dopant (i.e., an n-doped graphene layer; n-G). In FIGS. 1-3, the first electrode E10 is a p-doped graphene layer p-G and the second electrode E20 is an n-doped graphene layer n-G. However, the first electrode E10 may be an n-doped graphene layer n-G and the second electrode E20 may be a p-doped graphene layer p-G. A work function of the p-doped graphene layer p-G may be greater than about 4.5 eV and smaller than or equal to about 5.5 eV. For example, the work function of the p-doped graphene layer p-G may be about 4.9 eV to about 5.5 eV. A work function of the n-doped graphene layer n-G may be equal to or greater than about 3.5 eV and smaller than about 4.5 eV. For example, the work function of the n-doped graphene layer n-G may be about 3.5 eV to about 4.3 eV. A difference between the work functions of the p-doped graphene layer p-G and the n-doped graphene layer n-G may be about 0.1 eV to about 5 eV, for example, about 0.3 eV to about 3 eV. The doped graphene layer may include from about 1 layer to about 10 layers (or from about 1 layer to about 100 layers) of graphene. In other words, the doped graphene layer may be formed of or include a single graphene layer or formed of or include a stack of about 10 or less graphene layers (or about 100 or less graphene layers). The single graphene layer may have a low sheet resistance of about 100 Ω/sq and a low light absorbance of about 2.3%. Thus, graphene may be used as a transparent electrode having low electric resistance.

According to another example embodiment, the first electrode E10 or the second electrode E20 may be a layer formed of or include a metallic material other than doped graphene such as, for example, a metal, an alloy, or a conductive oxide. In other words, one of the first electrode E10 and the second electrode E20 may be a graphene layer doped with a p-type dopant or an n-type dopant, and the other of the first electrode E10 and the second electrode E20 may be a layer formed of or include the metallic material. In this case, a work function of the metallic material may be, for example, about 3.5 eV to about 6 eV. A difference between the work functions of the doped graphene layer and the metallic material layer may be about 0.1 eV to about 5 eV, for example, about 0.3 eV to about 3 eV. An energy barrier between the metallic material layer and the semiconductor active layer S10 may be about 1.5 eV or less, namely, about 0 eV to about 1.5 eV.

The semiconductor active layer S10 may include a 2D semiconductor having a 2D crystal structure. The 2D semiconductor may be a metal chalcogenide-based material. The metal chalcogenide-based material may include a transition metal from Mo, W, Nb, V, Ta, Ti, Zr, Hf, Tc, and Re, and a chalcogen element from S, Se, and Te. In this case, the metal chalcogenide-based material may be a transition metal dichalcogenide (TMDC) material. The TMDC material may be expressed as $MX_2$, for example, where M denotes a transition metal and X denotes a chalcogen element. M may be, for example, Mo, W, Nb, V, Ta, Ti, Zr, Hf, Tc, or Re, whereas X may be S, Se, or Te. The TMDC material may be, for example, $MoS_2$, $MoSe_2$, $MoTe_2$, $WS_2$, $WSe_2$, $WTe_2$, $ZrS_2$, $ZrSe_2$, $HfS_2$, $HfSe_2$, $NbSe_2$, or $ReSe_2$. The metal chalcogenide-based material may also not be expressed as $MX_2$. For example, a compound of Cu (transition metal) and S (chalcogen element) may be expressed as CuS, which is a transition metal chalcogenide material. Since the CuS may be a 2D material, the CuS may be applied as the metal chalcogenide-based material. The metal chalcogenide-based material may be a chalcogenide-based material including non-transition metal. The non-transition metal may be Ga, In, Sn, Ge, or Pb, for example. In other words, a compound of a non-transition metal, such as Ga, In, Sn, Ge, or Pb, and a chalcogen element, such as S, Se, or Te, may be used as the metal chalcogenide-based material. The chalcogenide-based material including the non-transition metal may be $SnSe_2$, GaS, GaSe, GaTe, GeSe, $In_2Se_3$, or $InSnS_2$, for example. Therefore, the metal chalcogenide-based material may include a metal element from Mo, W, Nb, V, Ta, Ti, Zr, Hf, Tc, Re, Cu, Ga, In, Sn, Ge, and Pb, and a chalcogen element from S, Se, and Te. However, the materials (elements) stated above are merely examples, and any of various other materials (elements) may be applied. Metal chalcogenide-based materials, including the TMDC material, may have a light absorbance that is about 100 times higher than the light absorbance of Si. Thus, thin and highly-efficient optoelectronic devices may be obtained by using the metal chalcogenide-based materials. When the semiconductor active layer S10 includes the 2D semiconductor, the semiconductor active layer S10 may be formed of or include a single 2D semiconductor layer or of a stack of single layers each having a 2D planar structure. Even if the single layer is repeatedly stacked, properties of a 2D material may be maintained. In terms of electric structure, a 2D material may be defined as a material of which density of state (DOS) depends on quantum well behavior. Also in a material having a structure in which a plurality of 2D unit material layers (about 100 or less layers) are stacked, DOS may depend on a quantum well behavior. Thus, the material having the structure in which single layers are repeatedly stacked may also be referred to as a "2D material (2D semiconductor)".

The material used to form the semiconductor active layer S10 is not limited to the 2D material (2D semiconductor), and may be any of other semiconductor materials. For example, the semiconductor active layer S10 may include a quantum dot (QD) having semiconductor characteristics. In other words, the semiconductor active layer S10 may be a QD-containing layer or a QD layer. A QD may have a high quantum yield and high stability, characteristics thereof may be easily controlled by adjusting a dot size, and a solution process may be possible for forming the QD. The semiconductor active layer S10 may include both a 2D material (2D semiconductor) and a QD. According to another example embodiment, the semiconductor active layer S10 may include at least one of various semiconductor materials, such as a Group IV-based semiconductor, such as Si, Ge, or SiGe, a Group III-V semiconductor, an oxide semiconductor, a nitride semiconductor, and an oxynitride semiconductor.

The semiconductor layer S10 may have a thickness of about 0.7 nm to several μm. When the semiconductor active layer S10 is formed of or include a monolayer of a 2D material, the thickness of the semiconductor active layer S10 may be about 0.7 nm, which is relatively thin. If the semiconductor active layer S10 is formed of or include a plurality of 2D material layers, the thickness of the semiconductor active layer S10 may be several nanometers to several tens of nm, or several nanometers to several hundreds of nm. When the semiconductor active layer S10 is formed of or include a general semiconductor material instead of a 2D material, the thickness of the semiconductor active layer S10 may be nanoscale or microscale. In this case, the thickness of the semiconductor active layer S10 may increase to 1 μm or greater. In some cases, the semiconductor active layer S10 may have a thickness of several tens of μm or several hundreds of μm. An energy bandgap of the semiconductor active layer S10 may be about 0.3 eV to about 3 eV. However, in some cases, the energy bandgap of the semiconductor active layer S10 may be about 3 eV or greater.

The semiconductor active layer S10 may have a desired, or alternatively predetermined built-in potential between the first and second electrodes E10 and E20. For example, the semiconductor active layer S10 may have a built-in potential of about 0.1 eV or greater. In one example embodiment, the semiconductor active layer S10 having the built-in potential of substantially 0.1 eV or greater is an enhanced semiconductor active layer S10. The built-in potential may be about 0.1 eV to about 5 eV, for example, about 0.3 eV to about 3 eV. The built-in potential of the semiconductor active layer S10 may be induced due to electrical asymmetry between the first electrode E10 and the second electrode E20 respectively contacting both ends of the semiconductor active layer S10. For example, a conduction band energy level and a valence band energy level of one end of the semiconductor active layer S10 that contacts the first electrode E10 may be increased by the first electrode E10, and a conduction band energy level and a valence band energy level of the other end of the semiconductor active layer S10 that contacts the second electrode E20 may be decreased by the second electrode E20. Consequently, while the energy band structure of the semiconductor active layer S10 is being changed, a built-in potential of about 0.1 eV or more, or of about 0.3 eV or more, may be generated between both ends of the semiconductor active layer S10. At this time, a Fermi energy level of the first electrode E10 may be closer (more adjacent) to a valence band of the semiconductor active layer S10 than to a conduction band thereof, and a Fermi energy level of the second electrode E20 may be closer (more adjacent) to the conduction band of the semiconductor active layer S10 than to the valence band thereof. The energy band structure of the semiconductor active layer S10 will be described in more detail later with reference to FIG. 4.

The semiconductor active layer S10 may have a desired, or alternatively predetermined built-in electric field between the first and second electrodes E10 and E20. For example, the semiconductor active layer S10 may have a built-in electric field of about 0.3 MV/cm or greater. The built-in electric field may be about 0.3 MV/cm to about 100 MV/cm, for example, about 1 MV/cm to about 70 MV/cm.

Due to the semiconductor active layer S10 having the above-described built-in potential and/or built-in electric field, the optoelectronic device according to at least one example embodiment may exhibit an excellent photoconductive property without applying an external voltage. In other words, electrons and holes generated in the semiconductor active layer S10 by light may be easily moved to the first and second electrodes E10 and E20 by the built-in potential/built-in electric field. When there is no built-in potential/built-in electric field, an external voltage needs to be applied to move the electrons and the holes. In this case, power consumption increases, and the structure of a device/system is complex as a result. However, according to an example embodiment, since an excellent photoconductive property may be secured without applying an external voltage, an optoelectronic device that consumes low power and has excellent photoelectric conversion efficiency may be realized. In particular, an optoelectronic device having high performance may be easily realized by using a 2D conductor, such as doped graphene, and/or a 2D semiconductor (or QD), such as metal chalcogenide.

In addition, as shown in FIGS. 1 and 3, the first electrode E10 may extend from the semiconductor active layer S10 in a first direction (e.g., a negative Y-axis direction), and the second electrode E20 may extend from the semiconductor active layer S10 in a second direction (e.g., the Y-axis direction) opposite the first direction. Thus, the optoelectronic device according to at least one example embodiment may have a straight line structure or a structure similar or same thereto, as viewed from the top (see FIG. 1). The optoelectronic device according to at least one example embodiment may further include a first contact electrode CE10 contacting (or electrically connected to) the first electrode E10, and a second contact electrode CE20 contacting (or electrically connected to) the second electrode E20. The first contact electrode CE10 and the second contact electrode CE20 may be apart from each other in a horizontal direction, for example, the Y-axis direction. The first contact electrode CE10 and the second contact electrode CE20 may be positioned on the same level (height) or on almost the same level (height). The semiconductor active layer S10 may be located between the first contact electrode CE10 and the second contact electrode CE20. The first electrode E10 may be considered to electrically connect the first contact electrode CE10 to a first region (for example, a lower surface) of semiconductor active layer S10, and the second electrode E20 may be considered to electrically connect the second contact electrode CE20 to a second region (for example, an upper surface) of the semiconductor active layer S10. A width of a stacked structure including the first electrode E10, the semiconductor active layer S10, and the second electrode E20 in the X-axis direction in FIG. 2, or a width of the semiconductor active layer S10 in the Y-axis direction in FIG. 3 may be, for example, several nm to several hundreds of μm.

A p-doped graphene layer or n-doped graphene layer that is applicable to the first electrode E10 or the second electrode E20 may be a layer doped via plasma doping or a layer doped via chemical doping. A graphene layer may be p-doped or n-doped via plasma processing, or p-doped or n-doped by treating with a solution including a dopant. In a case of using the plasma processing, n-doped graphene may be obtained by replacing some carbon (C) in the graphene with nitrogen (N) by using, for example, N plasma. When chemical doping is used, $AuCl_3$, $FeCl_3$, 9,10-Dibromoanthracene (An-Br), or tetrasodium 1,3,6,8-pyrenetetrasulfonic acid (TPA), for example, may be used as a source of a p-type dopant to accomplish p-doping. Also, diazonium-salt may be used as the source of the p-type dopant, and the diazonium-salt may include, for example, 4-Bromobenzene diazonium tetrafluoroborate (4-BBDT). Au in $AuCl_3$ may serve as a p-type dopant, and a bromine group in diazonium-salt may serve as a p-type dopant. The source of the p-type dopant may be an ionic liquid, such as $NO_2BF_4$, $NOBF_4$, or $NO_2SbF_6$, an acidic compound, such as HCl, $H_2PO_4$, $CH_3COOH$, $H_2SO_4$, or $HNO_3$, or an organic compound, such as dichlorodicyanoquinone (DDQ), oxone, dimyristoylphosphatidylinositol (DMPI), or trifluoromethanesulfoneimide. Alternatively, the source of the p-type dopant may be $HPtCl_4$, $HAuCl_4$, silver trifluoromethanesulfonate (AgOTf), $AgNO_3$, $H_2PdCl_6$, $Pd(OAc)_2$, $Cu(CN)_2$, or the like. For n-doping via chemical doping, "aromatic molecules with electron-donor groups" or ammonium fluoride, for example, may be used as a source of the n-type dopant. Here, "aromatic molecules with electron-donor groups" may be, for example, 9,10-Dimethylanthracene ($An-CH_3$) or 1,5-Naphthalenediamine ($Na-NH_2$). The source of the n-type dopant may be a compound including nicotinamide, a reduction product of a substituted or unsubstituted nicotinamide, a reduction product of a compound which is chemically bound to a substituted or unsubstituted nicotinamide, or a compound comprising at least two pyridinium moieties in which a nitrogen atom of at least one of the pyridinium moieties is reduced. For example, the source of the n-type dopant may include nicotinamide mononucleotide (NMN), nicotinamide adenine dinucleotide (NAD), nicotinamide adenine dinucleotide phosphate (NADP), nicotinamide mononucleotide-H (NMNH), nicotinamide adenine dinucleotide-H (NADH), or nicotinamide adenine dinucleotide phosphate-H (NADPH) or may include viologen. The viologen may include, for example, at least one of 1,1'dibenzyl-4,4'-bipyridinium dichloride, methyl viologen dichloride hydrate, ethyl viologen diperchlorate, 1,1'dioctadecyl-4,4'-bipyridinium dibromide, and di-octyl bis(4-pyridyl)biphenyl viologen. The viologen may further include a molecular structure capable of conjugation between two pyridine structures. In this case, the molecular structure may include aryl, alkenyl, alkynyl, or the like. Alternatively, the source of the n-type dopant may include a polymer, such as polyethylenimine (PEI). Nitrogen atoms in the viologen may serve as an n-type dopant, and an amine group in PEI may serve as an n-type dopant. Alternatively, the n-type dopant may include an alkali metal, such as K or Li. However, the materials (sources) of the p-type dopant and the n-type dopant stated above are merely examples, and any of various other materials may be used.

The optoelectronic device according to at least one example embodiment may be a photovoltaic device or a photodetector. The photodetector may be a self-powered photodetector capable of exhibiting a photoconductive property without applying an external voltage. The photovoltaic device may be, for example, a solar cell. Due to the semiconductor active layer S10 having a built-in potential and at least one of the first and second electrodes E10 and E20 and the semiconductor active layer S10 including a 2D material, the photovoltaic device may have a good photovoltaic property. The optoelectronic device according to at least one example embodiment may not only be applicable to light receiving devices, such as a photodetector and a photovoltaic device, but, in some cases, may also be applicable to light emitting devices.

Figure 4:
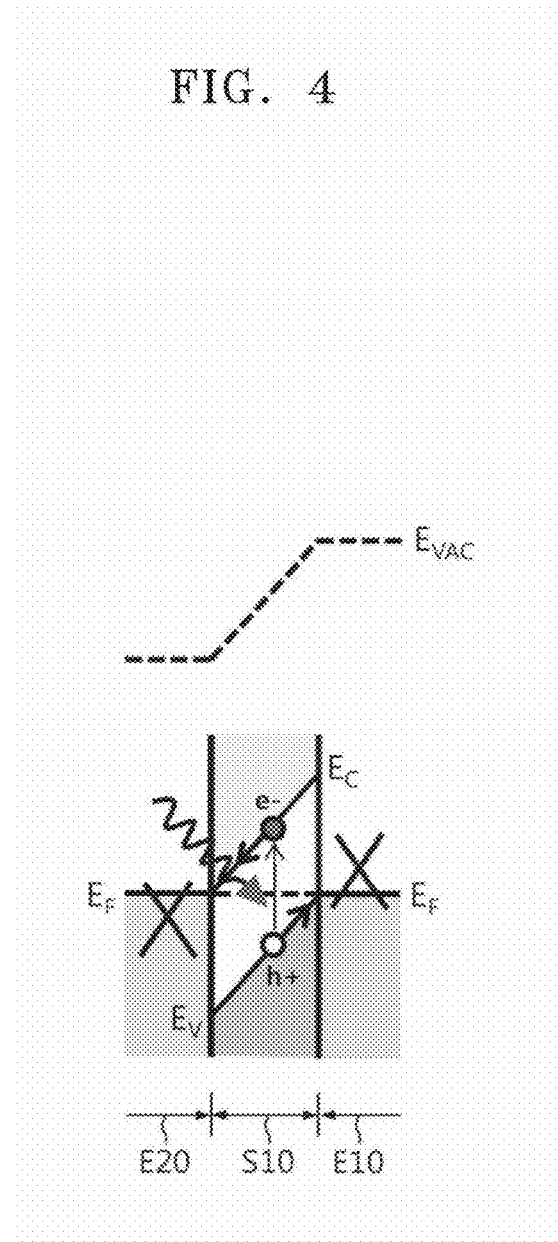
FIG. 4 is an energy band diagram of the optoelectronic device of FIGS. 1-3 when the optoelectronic device is in an equilibrium state.

FIG. 4 is an energy band diagram of the optoelectronic device of FIGS. 1-3 when the optoelectronic device is in an equilibrium state. The equilibrium state may be a state where no voltage is applied to the first and second electrodes E10 and E20. In the equilibrium state, as illustrated in FIG. 4, Fermi energy levels EF of the first and second electrodes E10 and E20 are substantially identical to each another. In FIG. 4, reference characters EV and EC indicate a valence band maximum energy level and a conduction band minimum energy level, respectively, and EVAC indicates a vacuum energy level. These indications also apply to FIGS. 5-8 and 27.

Referring to FIG. 4, the first electrode E10 may be a graphene layer doped with a p-type dopant (i.e., a p-doped graphene layer), and the second electrode E20 may be a graphene layer doped with an n-type dopant (i.e., an n-doped graphene layer). In this case, a Dirac point of the p-doped graphene layer may be higher than the Fermi energy level EF, and a Dirac point of the n-doped graphene layer may be lower than the Fermi energy level EF. As the first electrode E10 and the second electrode E20 are doped with opposite types of dopants, an energy band of the semiconductor active layer S10 existing between the first and second electrodes E10 and E20 may have an inclined structure as shown in FIG. 4. In other words, a valence band maximum energy level EV and a conduction band minimum energy level EV of the semiconductor active layer S10 on the side of the first electrode E10 may be increased, and a valence band maximum energy level EV and a conduction band minimum energy level EC of the semiconductor active layer S10 on the side of the second electrode E20 may be decreased. Accordingly, the Fermi energy level EF of the first electrode (p-doped graphene layer) E10 may be closer (more adjacent) to the valence band minimum energy level EV of the semiconductor active layer S10 than to the conduction band minimum energy level EC thereof, and the Fermi energy level EF of the second electrode (n-doped graphene layer) E20 may be closer (more adjacent) to the conduction band minimum energy level EC of the semiconductor active layer S10 than to the valence band minimum energy level EV thereof. Thus, the semiconductor active layer S10 may have a built-in potential of about 0.1 eV or greater, or about 0.3 eV or greater. The semiconductor active layer S10 may have a built-in electric field of about 0.3 MV/cm or greater, or about 1 MV/cm or greater. Thus, electrons 'e' and holes 'h' generated in the semiconductor active layer S10 by light may be separated and moved to the first and second electrodes E10 and E20 by the built-in potential and/or the built-in electric field. This may mean that the photoconductive property is induced without applying an external voltage. In other words, the photoconductive property may be improved by the built-in potential and/or the built-in electric field, and the efficiency of separating the electrons 'e' and holes 'h' from each other within the semiconductor active layer S10 may be improved.

Figure 5:
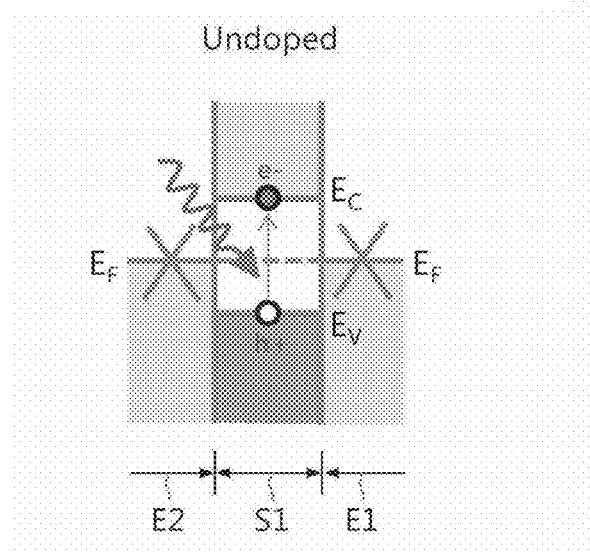
FIG. 5 is an energy band diagram of an optoelectronic device according to a comparative example when the optoelectronic device is in an equilibrium state.

FIG. 5 is an energy band diagram of an optoelectronic device according to a comparative example when the optoelectronic device is in an equilibrium state. The optoelectronic device according to the comparative example is similar to or the same as the optoelectronic device of FIG. 4 except that undoped graphene layers are used as first and second electrodes E1 and E2. For convenience of explanation, FIG. 5 does not illustrate a vacuum energy level.

Referring to FIG. 5, when undoped graphene layers are used as the first and second electrodes E1 and E2, a semiconductor active layer S1 has no or little built-in potential. Thus, the photoconductive property may be hardly appeared, and photoelectric efficiency may be very low. Accordingly, in this case, as shown in FIG. 6, a desired, or alternatively predetermined external voltage needs to be applied between the first and second electrodes E1 and E2.

Figure 6:
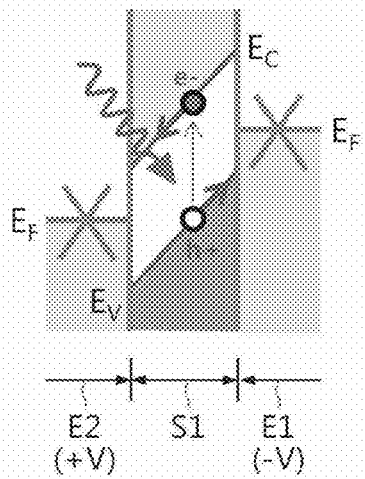
FIG. 6 is an energy band diagram modified from FIG. 5 when an external voltage is applied to the optoelectronic device according to the comparative example of FIG. 5.

FIG. 6 is an energy band diagram modified from FIG. 5 when an external voltage is applied to the optoelectronic device according to the comparative example of FIG. 5. In other words, FIG. 6 is an energy band diagram when a desired, or alternatively predetermined negative voltage (−V) has been applied to the first electrode E1 of the optoelectronic device according to the comparative example of FIG. 5 and a desired, or alternatively predetermined positive voltage (+V) has been applied to the second electrode E2 of the optoelectronic device according to the comparative example of FIG. 5.

Referring to FIG. 6, a band structure of the semiconductor active layer S1 is inclined due to an external voltage applied between the first electrode E1 and the second electrode E2, and consequently, the photoconductive property may be appeared. However, in this case, since the external voltage need to be applied, power consumption increases and the structure of a device/system is complicated.

However, according to an example embodiment, as described above with reference to FIG. 4, an excellent photoconductive property and high photoelectric conversion efficiency may be obtained without applying an external voltage. Thus, high-performance optoelectronic devices capable of operating in a low-power or zero-bias state may be realized.

In FIG. 4, a p-doped graphene layer is used as the first electrode E10 and an n-doped graphene layer is used as the second electrode E20. However, according to another example embodiment, one of the first and second electrodes E10 and E20 may be formed of or include a metallic material. This example embodiment will be described below with reference to FIGS. 7 through 8.

Figure 7:
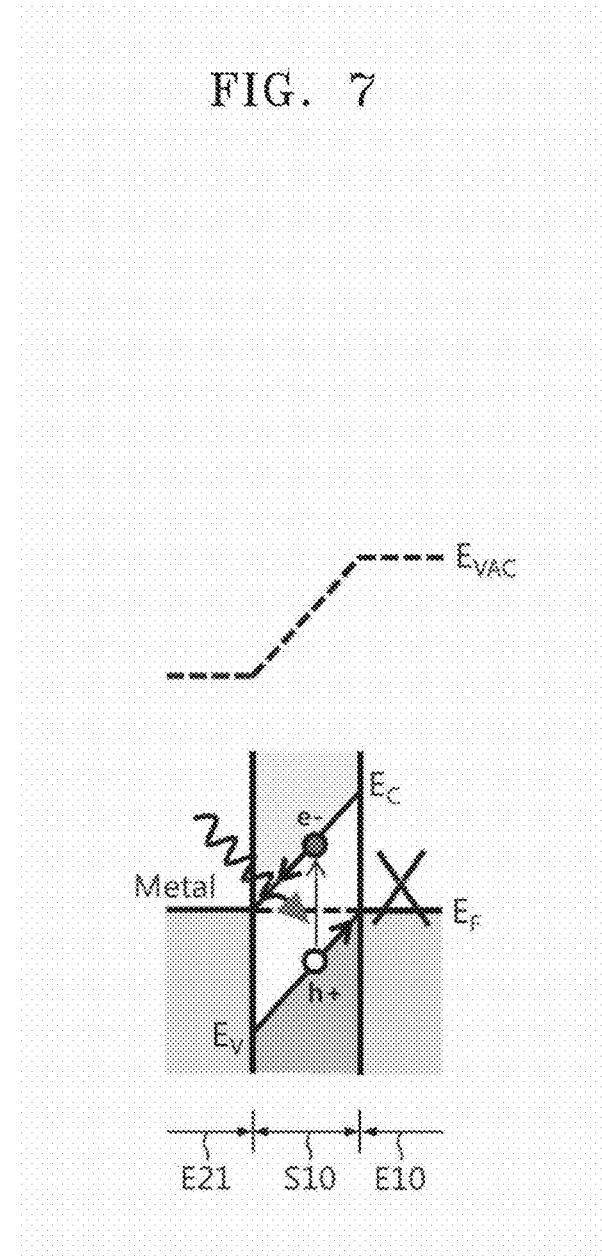
FIG. 7 is an energy band diagram of an optoelectronic device according to another example embodiment when the optoelectronic device is in an equilibrium state.

FIG. 7 is an energy band diagram of an optoelectronic device according to another example embodiment when the optoelectronic device is in an equilibrium state. FIG. 7 illustrates a case where a p-doped graphene layer is used as a first electrode E10 and a metallic material layer is used as a second electrode E21.

Referring to FIG. 7, when the p-doped graphene layer is used as the first electrode E10 and the metallic material layer is used as the second electrode E21, the metallic material layer of the second electrode E21 may have a smaller work function than the p-doped graphene layer of the first electrode E10. A difference between the work functions of the p-doped graphene layer and the metallic material layer may be about 0.1 eV to about 5 eV. Alternatively, the work function difference may be about 0.3 eV to about 3 eV. A built-in potential and a built-in electric field may be generated within a semiconductor active layer S10 interposed between the first electrode E10 and the second electrode E21. The built-in potential and the built-in electric field may be similar to or the same as those described above with reference to FIG. 4.

Figure 8:
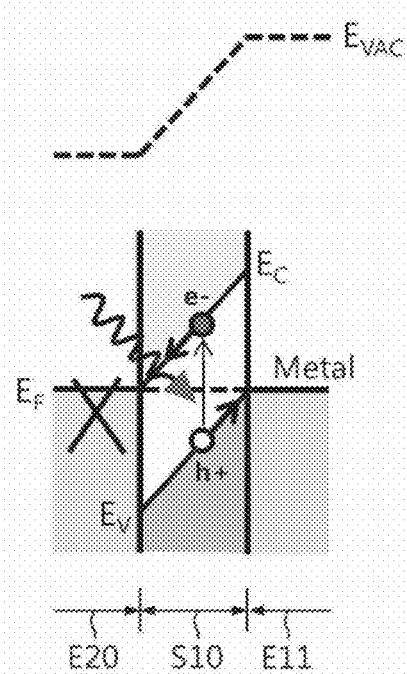
FIG. 8 is an energy band diagram of an optoelectronic device according to another example embodiment when the optoelectronic device is in an equilibrium state.

FIG. 8 is an energy band diagram of an optoelectronic device according to another example embodiment when the optoelectronic device is in an equilibrium state. FIG. 8 illustrates a case where a metallic material layer is used as a first electrode E11 and an n-doped graphene layer is used as a second electrode E20.

Referring to FIG. 8, when the metallic material layer is used as the first electrode E11 and the n-doped graphene layer is used as the second electrode E20, the metallic material layer of the first electrode E11 may have a greater work function than the n-doped graphene layer of the second electrode E20. A difference between the work functions of the n-doped graphene layer and the metallic material layer may be about 0.1 eV to about 5 eV. Alternatively, the work function difference may be about 0.3 eV to about 3 eV. A built-in potential and a built-in electric field may be generated within a semiconductor active layer S10 interposed between the first electrode E11 and the second electrode E20. The built-in potential and the built-in electric field may be similar to or the same as those described above with reference to FIG. 4.

According to example embodiments, at least one of a first region (region including a first end) of the semiconductor active layer S10 adjacent to the first electrode E10 or E11 and a second region (region including a second end) of the semiconductor active layer S10 adjacent to the second electrode E20 or E21 may be a doped region. These example embodiments will be described below with reference to FIGS. 9-12.

Figure 9:
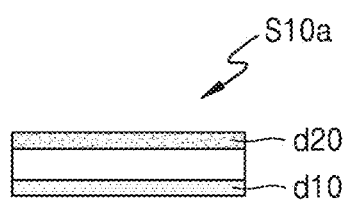
FIG. 9 is a cross-sectional view of a semiconductor active layer that is applicable to an optoelectronic device according to another example embodiment.

FIG. 9 is a cross-sectional view of a semiconductor active layer S10a that is applicable to an optoelectronic device according to another example embodiment.

Referring to FIG. 9, the semiconductor active layer S10a may include a first doped region d10 and a second doped region d20. The first and second doped regions d10 and d20 may be regions doped with opposite types of dopants. The first doped region d10 may be a region adjacent to (or contacting) a first electrode (not shown) (ex, the first electrode E10 of FIG. 3), and the second doped region d20 may be a region adjacent to (or contacting) a second electrode (not shown) (e.g., the second electrode E20 of FIG. 3). When the first electrode is doped with a dopant of a first type, the first doped region d1.0 adjacent to the first electrode may also be doped with a dopant of the first type. When the second electrode is doped with a dopant of a second type, the second doped region d20 adjacent to the second electrode may also be doped with a dopant of the second type. For example, the first doped region d10 may be a region doped with a p-type dopant, and the second doped region d20 may be a region doped with an n-type dopant. However, impurity types (p/n) of the first and second doped regions d10 and d20 may be switched around. Each of the first and second doped regions d10 and d20 may have a thickness of several nm or greater. An undoped region may exist between the first doped region d10 and the second doped region d20.

Figure 10:
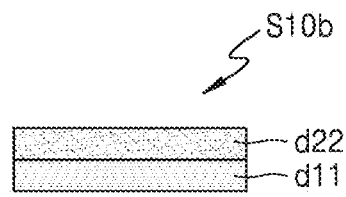
FIG. 10 is a cross-sectional view of a semiconductor active layer that is applicable to an optoelectronic device according to another example embodiment.

In the example embodiment of FIG. 9, the first doped region d10 and the second doped region d20 are spaced apart from each other. However, according to another example embodiment, they may contact each other at least partially. This example embodiment is illustrated in FIG. 10. Referring to FIG. 10, a semiconductor active layer S10b may include a first doped region d11 and a second doped region d22, and the first doped region d11 and the second doped region d22 may contact each other.

Figure 11:
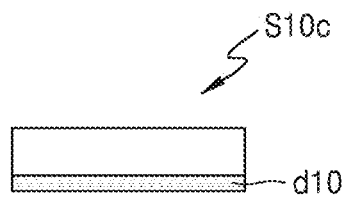
FIG. 11 is a cross-sectional view of a semiconductor active layer that is applicable to an optoelectronic device according to another example embodiment.
Figure 12:
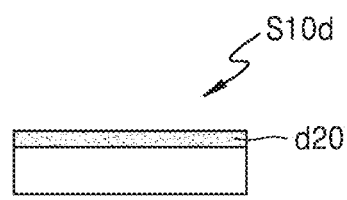
FIG. 12 is a cross-sectional view of a semiconductor active layer that is applicable to an optoelectronic device according to another example embodiment.

In the example embodiment of FIG. 9 or 10, any one of the first doped region d10 or d11 and the second doped region d20 or d22 may not be included. In other words, one of the first doped region d10 or d11 and the second doped region d20 or d22 may not be doped and maintains an undoped state. For example, as shown in FIG. 11, a semiconductor active layer S10c may have only one doped region d10 formed on one end (lower surface) thereof. Alternatively, as shown in FIG. 12, a semiconductor active layer S10d may have only one doped region d20 formed on the other end (upper surface) thereof. When one of first and second electrodes (not shown) is a doped graphene layer and the other is a metallic material layer, a semiconductor active layer included between the first and second electrodes may have the same structure as the structure of FIG. 11 or 12. For example, the semiconductor active layer S10c of FIG. 11 may be applied to the semiconductor active layer S10 of the optoelectronic device of FIG. 7, and the semiconductor active layer S10d of FIG. 12 may be applied to the semiconductor active layer S10 of the optoelectronic device of FIG. 8. However, even when the metallic material layer is applied to one of the first and second electrodes (not shown), the semiconductor active layers S10a and S10b of FIGS. 9 and 10 may be used.

When at least one doped region d10, d11, d20, and/or d22 is included in the semiconductor active layers S10a-S10d as shown in FIGS. 9-12, the built-in potentials and the built-in electric fields of the semiconductor active layers S10a-S10d may be increased by the doped regions d10, d11, d20, and/or d22. In particular, when one end of a semiconductor active layer that is in contact with a first electrode is doped with a dopant of the same type as the type of dopant of the first electrode and the other end thereof that is in contact with a second electrode is doped with a dopant of the same type as the type of dopant of the second electrode, reinforcement of the built-in potential and the built-in electric field may be more increased.

In addition, the doped regions d10, d11, d20, and d22 of FIGS. 9-12 may be formed by, for example, plasma doping or chemical doping. For example, at least a portion of the semiconductor layer may be doped with an n-type dopant by dipping at least the portion of the semiconductor layer into a $Cl_2$- or Cl-containing solution. Alternatively, at least a portion of a semiconductor layer may be doped with a p-type dopant by processing at least the portion of the semiconductor layer with a NOx-containing solution. This process may be referred to as NOx chemisorption, and may be performed at, for example, about 150° C. When the chemical doping is used, the materials (sources) of a p-type dopant and an n-type dopant may be the same as or similar to the materials (sources) of a p-type dopant and an n-type dopant for doping a graphene layer. In some cases, the doped regions d10, d11, d20, and d22 may be formed by ion implantation.

Figure 13:
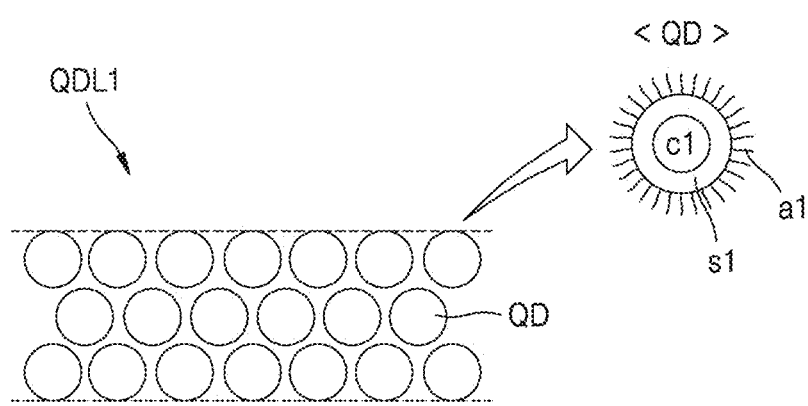
FIG. 13 is a cross-sectional view of a quantum dot (QD) layer that is applicable to a semiconductor active layer of an optoelectronic device according to another example embodiment.

FIG. 13 is a cross-sectional view of a QD layer QDL1 that is applicable to a semiconductor active layer of an optoelectronic device according to another example embodiment.

Referring to FIG. 13, the QD layer QDL1 may include a plurality of quantum dots QD. The plurality of quantum dots QD may form a single- or multi-layered structure. Each of the quantum dots QD may have a core portion c1 and a shell portion s1, and the shell portion s1 may have a single shell structure or a double shell structure. The core portion c1 may be formed of or include, for example, CdSe, InP, PbS, PbSe, or CdTe, and the shell portion s1 may be formed of or include, for example, CdS or ZnS. Each quantum dot QD having this structure may have a diameter of about 10 nm or less. Organic ligands al may exist on the surface of each quantum dot QD. The organic ligands al may be, for example, oleic acid, trioctylphosphine, trioctylamine, or trioctylphosphine oxide. In some cases, the organic ligands al may be removed. The quantum dot QD may be a colloidal quantum dot. The structure of the QD layer QDL1 illustrated in FIG. 13 is only an example, and a detailed material and a detailed structure thereof may vary.

Various modifications may be made to the structure of the optoelectronic device described above with reference to FIGS. 1-3. Various modified structures of an optoelectronic device will now be described in detail with reference to FIGS. 14-18.

Figure 14:
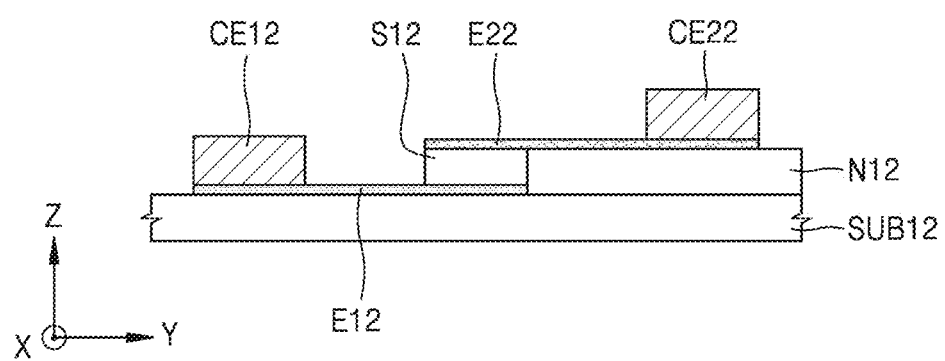
FIG. 14 is a cross-sectional view of an optoelectronic device according to another example embodiment.

FIG. 14 is a cross-sectional view of an optoelectronic device according to another example embodiment.

Referring to FIG. 14, the optoelectronic device has a similar or same structure to the structure illustrated in FIG. 3, and may further include an insulation layer N12 interposed between a substrate SUB12 and a second electrode E22. The insulation layer N12 may have a height that is the same as or similar to the height of a semiconductor active layer S12. The second electrode E22 may be formed on the semiconductor active layer S12 and the insulation layer N12. Thus, the second electrode E22 may have a flat or nearly-flat structure. The insulation layer N12 may serve as a support for supporting the second electrode E22. A first contact electrode CE12 formed on the first electrode E12 and a second contact electrode CE22 formed on the second electrode E22 may be at different heights. The first contact electrode CE12 and the second contact electrode CE22 may be spaced apart from each other in the horizontal direction, and may not overlap each other in the vertical direction.

Figure 15:
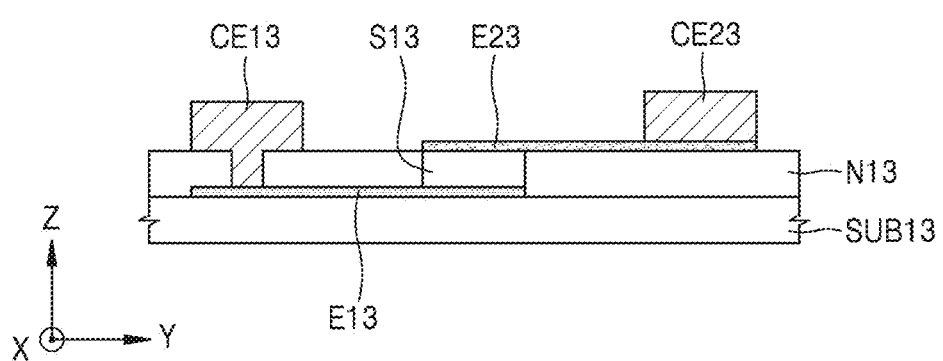
FIG. 15 is a cross-sectional view of an optoelectronic device according to another example embodiment.

FIG. 15 is a cross-sectional view of an optoelectronic device according to another example embodiment.

Referring to FIG. 15, a first electrode E13 may be formed on a substrate SUB13, and an insulation layer N13 may be formed on the substrate SUB13 so as to cover the first electrode E13. A semiconductor active layer S13 may be formed within the insulation layer N13 and in contact with the first electrode E13. An aperture via which a portion of the first electrode E13 is exposed may be formed within the insulation layer N13, and the semiconductor active layer S13 may be formed within the aperture. An upper surface of the semiconductor active layer S13 and an upper surface of the insulation layer N13 may have identical, same or similar heights. A second electrode E23 may be formed on the insulation layer N13 and in contact with the semiconductor active layer S13. A first contact electrode CE13 electrically connected to (contacting) the first electrode E13 may be formed on the insulation layer N13, and a second contact electrode CE23 contacting the second electrode E20 may be formed.

Figure 16:
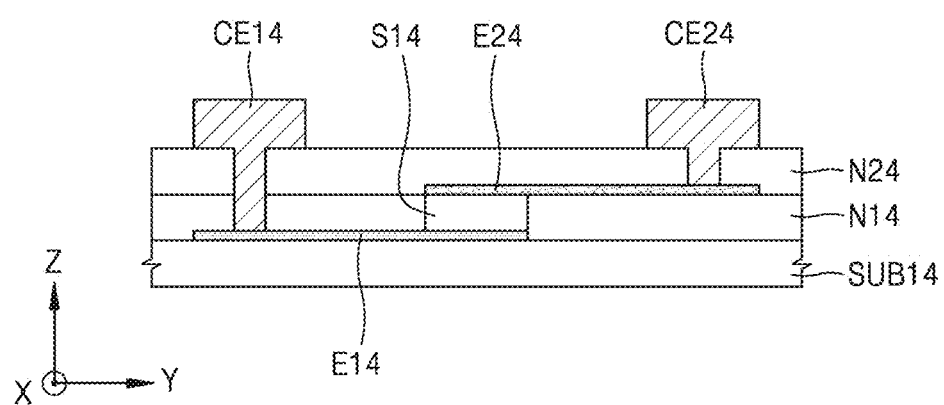
FIG. 16 is a cross-sectional view of an optoelectronic device according to another example embodiment.

FIG. 16 is a cross-sectional view of an optoelectronic device according to another example embodiment.

Referring to FIG. 16, a substrate SUB14, a first electrode E14, a semiconductor active layer S14, a first insulation layer N14, and a second electrode E24 may respectively correspond to the substrate SUB13, the first electrode E13, the semiconductor active layer S13, the insulation layer N13, and the second electrode E23 of FIG. 15. According to an example embodiment, a second insulation layer N24 formed on the first insulation layer N14 so as to cover the second electrode E24 may be further included. A first contact electrode CE14 electrically connected to (contacting) the first electrode E14 may be formed on the second insulation layer N24, and a second contact electrode CE23 electrically connected to (contacting) the second electrode E20 may be formed on the second insulation layer N24. In this case, the first contact electrode CE14 and the second contact electrode CE24 may be positioned at the same height or at almost the same height.

Figure 17:
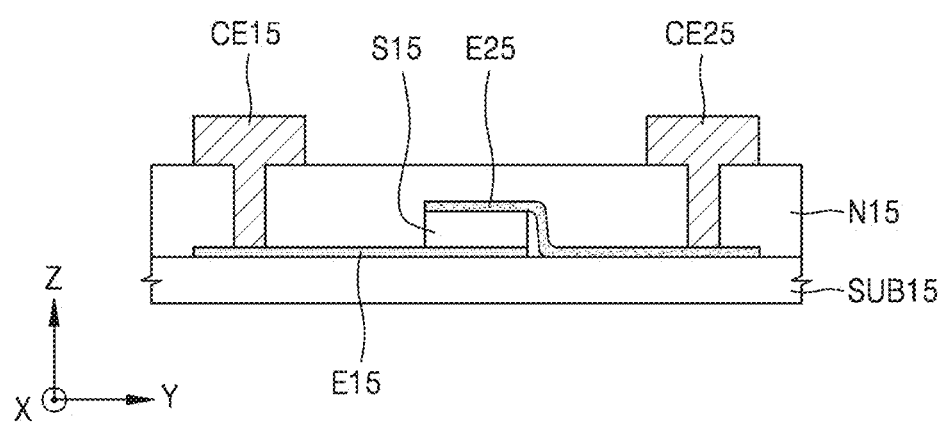
FIG. 17 is a cross-sectional view of an optoelectronic device according to another example embodiment.

FIG. 17 is a cross-sectional view of an optoelectronic device according to another example embodiment.

Referring to FIG. 17, a first electrode E15, a semiconductor active layer S15, and a second electrode E25 may be formed on a substrate SUB15. The first electrode E15, the semiconductor active layer S15, and the second electrode E25 of FIG. 17 may be the same as or similar to the first electrode E10, the semiconductor active layer S10, and the second electrode E20 of FIG. 3, respectively. According to an example embodiment, an insulation layer N15 covering the first electrode E15, the semiconductor active layer S15, and the second electrode E25 may be formed on the substrate SUB15. The insulation layer N15 may serve as a passivation layer that protects the first electrode E15, the second electrode E25, and the semiconductor active layer S15. A first contact electrode CE15 electrically connected to (contacting) the first electrode E15 may be formed on the insulation layer N15, and a second contact electrode CE23 electrically connected to (contacting) the second electrode E25 may be formed on the insulation layer N15.

Figure 18:
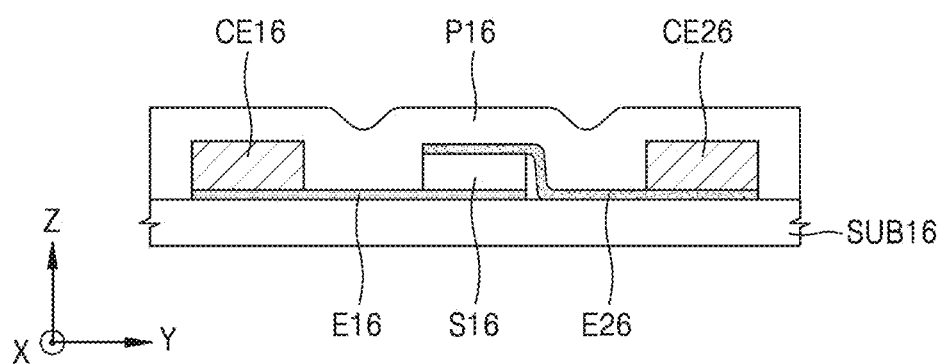
FIG. 18 is a cross-sectional view of an optoelectronic device according to another example embodiment.

FIG. 18 is a cross-sectional view of an optoelectronic device according to another example embodiment.

Referring to FIG. 18, the optoelectronic device may further include a passivation layer P16 formed on the structure of FIG. 3. A substrate SUB16, a first electrode E16, a semiconductor active layer S16, a second electrode E26, a first contact electrode CE16, and a second contact electrode CE26 may respectively correspond to the substrate SUB10, the first electrode E10, the semiconductor active layer S10, the second electrode E20, the first contact electrode CE10, and the second contact electrode CE20 of FIG. 3. The passivation layer P16 may be formed on the substrate SUB16 so as to cover the components SUB16, E16, S16, E26, CE16, and CE26. In particular, the passivation layer P16 may protect a doped graphene layer applied to at least one of the first and second electrodes E16 and E26, and reduce or substantially prevent deterioration (degradation) of the doped graphene layer. The passivation layer P16 may be formed of or include a dielectric (insulator), such as $SiO_2$, $SiN_x$, $Al_2O_3$, $HfO_x$, or $ZrO_x$, or may be formed of or include a 2D insulator, such as hexagonal boron nitride (h-BN). The passivation layer P16 may be formed by using any of various methods such as chemical vapor deposition (CVD), physical vapor deposition (PVD), and atomic layer deposition (ALD). The passivation layer P16 of FIG. 18 may be applied to the optoelectronic devices of FIGS. 14-17.

According to the example embodiment of FIGS. 1-3 and the example embodiments of FIGS. 14-18, the first contact electrodes CE10 and CE12-CE16 are spaced apart from the second contact electrodes CE20 and CE22-CE26, respectively, in the horizontal direction and accordingly do not overlap the second contact electrodes CE20 and CE22-CE26, respectively. However, according to another example embodiment, a first contact electrode and a second contact electrode may be spaced apart from each other in the vertical direction and may overlap each other in the vertical direction. This example embodiment is illustrated in FIG. 19.

Figure 19:
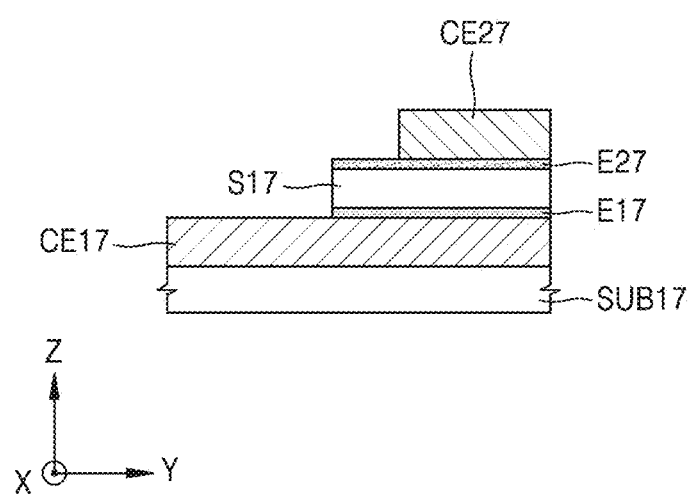
FIG. 19 is a cross-sectional view of an optoelectronic device according to another example embodiment.

FIG. 19 is a cross-sectional view of an optoelectronic device according to another example embodiment.

Referring to FIG. 19, a first contact electrode CE17 may be formed on a substrate SUB17, and a second contact electrode CE27 spaced apart from the first contact electrode CE17 in the vertical direction may be formed. A semiconductor active layer S17 may be interposed between the first contact electrode CE17 and the second contact electrode CE27. A first electrode E17 may be interposed between the first contact electrode CE17 and the semiconductor active layer S17, and a second electrode E27 may be interposed between the second contact electrode CE27 and the semiconductor active layer S17. Respective materials and properties of the substrate SUB17, the first electrode E17, the second electrode E27, the semiconductor active layer S17, the first contact electrode CE17, and the second contact electrode CE27 may be respectively the same as or similar to the materials and properties of the substrate SUB10, the first electrode E10, the second electrode E20, the semiconductor active layer S10, the first contact electrode CE10, and the second contact electrode CE20 of FIGS. 1-3. A portion of an upper surface of the first contact electrode CE17 may be exposed due to not being entirely covered by the first electrode E17, the semiconductor active layer S17, and the second electrode E27. The first electrode E17, the semiconductor active layer S17, and the second electrode E27 may be patterned to have the same width or similar widths. The second contact electrode CE27 may be formed to have a smaller size (width) than the second electrode E27 or to have the same size (width) as the second electrode E27. The structure of FIG. 19 is only an example, and various modifications may be made to the structure of FIG. 19. For example, the first contact electrode CE17, the first electrode E17, the semiconductor active layer S17, the second electrode E27, and the second contact electrode CE27 may have the same size (width) or similar sizes (widths). In some cases, the substrate SUB17 may not be included. Various other changes may also be made to the structure of FIG. 19.

According to another example embodiment, the optoelectronic devices described above with reference to FIGS. 1-4 and 7-19 may further include a third electrode, namely, a gate electrode, for applying an electric field to the semiconductor active layers S10, S10a-S10d, and S12-S17. By applying a desired, or alternatively predetermined electric field to the semiconductor active layers S10, S10a-S10d, and S12-S17 by using the gate electrode, characteristics of the semiconductor active layers S10, S10a-S10d, and S12-S17 may be controlled, and consequently, characteristics of the optoelectronic devices may be controlled.

According to the example embodiment of FIG. 1, a unit cell of the optoelectronic device has an overall straight line structure. However, a unit cell of an optoelectronic device according to another example embodiment may have various structures, such as a bent (curved) structure or a crisscross structure as viewed from the top. This example embodiment is illustrated in FIGS. 20 and 21.

Figure 20:
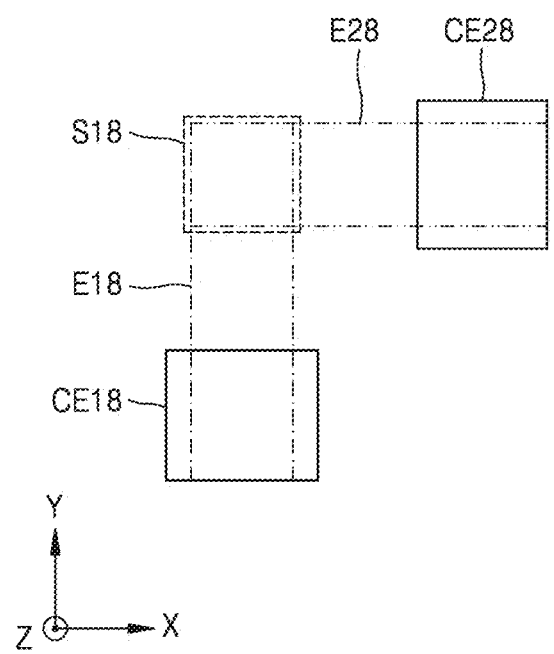
FIG. 20 is a plan view of an optoelectronic device according to another example embodiment.

FIG. 20 is a plan view showing a planar structure of an optoelectronic device according to another example embodiment. The structure of FIG. 20 is a modification of the structure of FIG. 1.

Referring to FIG. 20, a first electrode E18 may extend from a semiconductor active layer S18 in a first direction (e.g., a negative Y-axis direction), and a second electrode E28 may extend from the semiconductor active layer S18 in a second direction (e.g., an X-axis direction) perpendicular to the first direction. A first contact electrode CE18 may be formed on an end of the first electrode E18, and a second contact electrode CE28 may be formed on an end of the second electrode E28. Thus, the optoelectronic device according to an example embodiment may have a bent structure as viewed from the top. Although the first electrode E18 and the second electrode E28 form an angle of 90° in an example embodiment, the two electrodes E18 and E28 may be disposed to form an angle (acute or obtuse angle) other than 90°.

Figure 21:
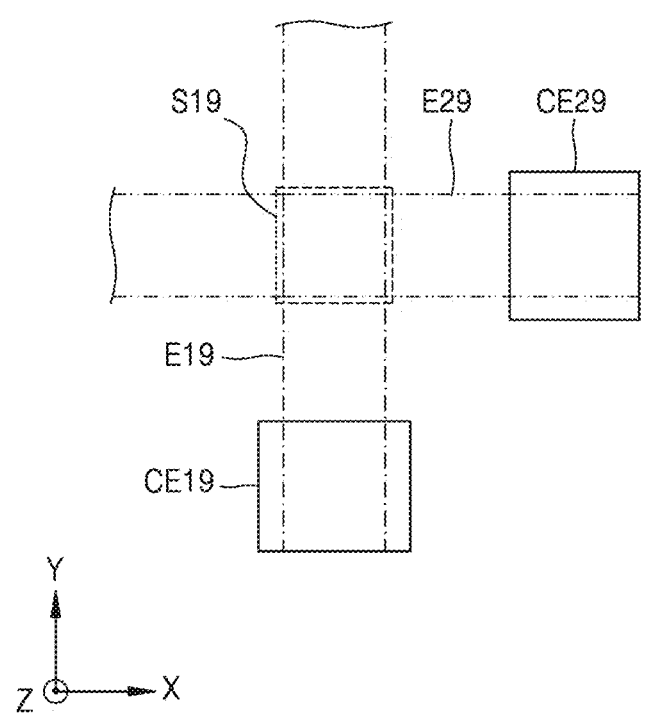
FIG. 21 is a plan view of an optoelectronic device according to another example embodiment.

FIG. 21 is a plan view showing a planar structure of an optoelectronic device according to another example embodiment. The structure of FIG. 21 is a modification of the structure of FIG. 20.

Referring to FIG. 21, the optoelectronic device according to an example embodiment may have a crisscross structure. In other words, the optoelectronic device according to an example embodiment may have a cross-point structure. In more detail, a first electrode E19 and a second electrode E29 may be disposed to intersect with each other, for example, to intersect with each other at a right angle, and a semiconductor active layer E19 may be formed on an intersection between the two electrodes E19 and E29. A first contact electrode CE19 may be formed on an end of the first electrode E19, and a second contact electrode CE29 may be formed on an end of the second electrode E29.

An optoelectronic device as illustrated in FIG. 1, 20, or 21 may constitute one unit cell, and a plurality of such unit cells may be arranged. The plurality of unit cells may be connected to each other by at least one common electrode. An example of using the common electrode is illustrated in FIG. 22.

Figure 22:
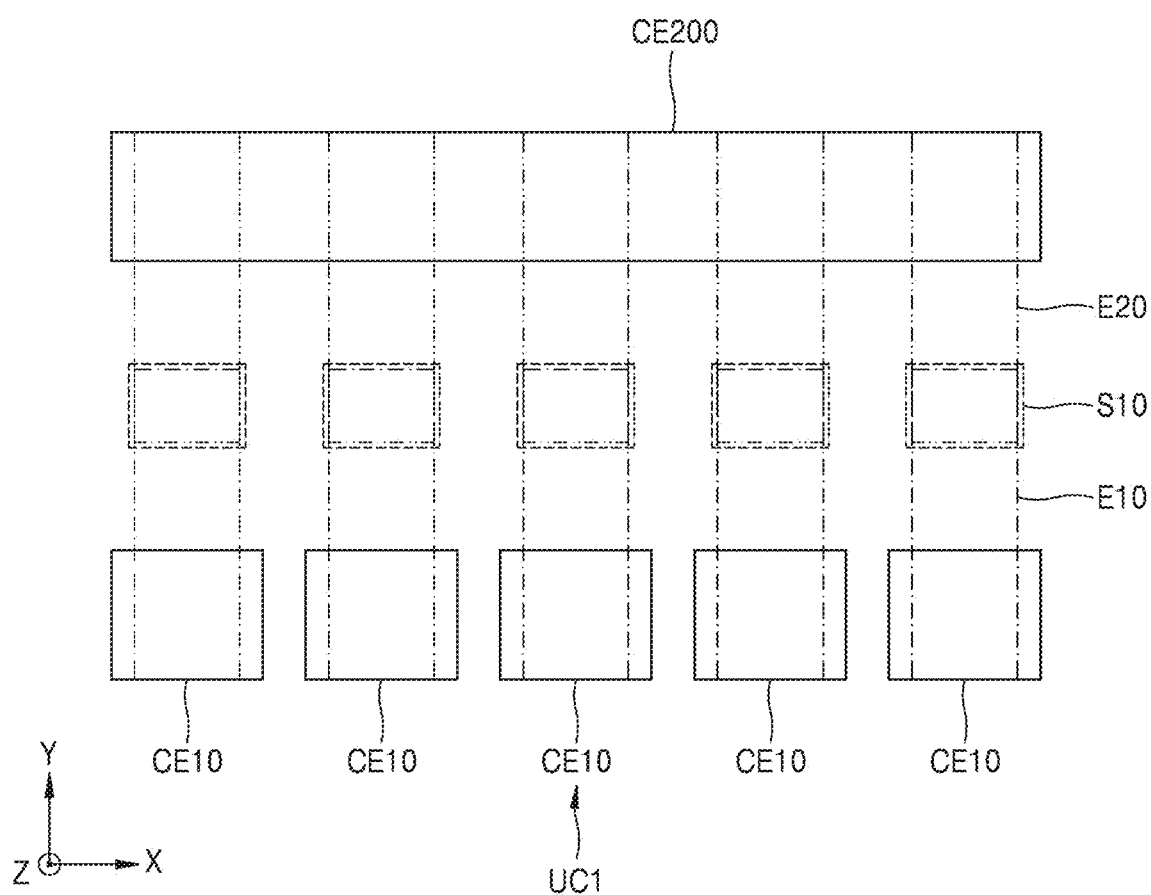
FIG. 22 is a plan view of an optoelectronic device according to another example embodiment.

FIG. 22 is a plan view of an optoelectronic device according to another example embodiment.

Referring to FIG. 22, a plurality of unit cells UC1 may be arranged. For example, the plurality of unit cells UC1 may be spaced apart from each other at regular intervals in a desired, or alternatively predetermined direction (ex, the X-axis direction). Each of the unit cells UC1 may include a first electrode E10, a second electrode E20, and a semiconductor active layer S10 interposed therebetween. A structure of each unit cell UC1 may be the same as or similar to the structure of FIG. 1. A plurality of first contact electrodes CE10 may be connected to first ends of the plurality of unit cells UC1, respectively. A second contact electrode CE200 may be commonly connected to second ends of the plurality of unit cells UC1. The second contact electrode CE200 may be considered a common electrode shared by the plurality of unit cells UC1.

When each unit cell UC1 in the structure of FIG. 22 is used as a photodetector, the plurality of semiconductor active layers S10 may absorb and detect light beams of different wavelengths. In this case, each of the semiconductor active layers S10 may be considered as a type of pixel. Thus, the structure of FIG. 22 may be considered a structure in which multiple pixels are bound by a common electrode (i.e., the second contact electrode CE200). When a structure as illustrated in FIG. 22 is used, light beams of different wavelengths may be separately detected, and information corresponding to the detected light beams may be used to realize an image corresponding to the information. The array structure of FIG. 22 is only an example, and various modifications may be made to the array structure of FIG. 22. For example, various array structures may be realized by using the structure of FIG. 20 or 21 as a unit structure, and individual electrodes instead of one common electrode may be used.

Figure 23:
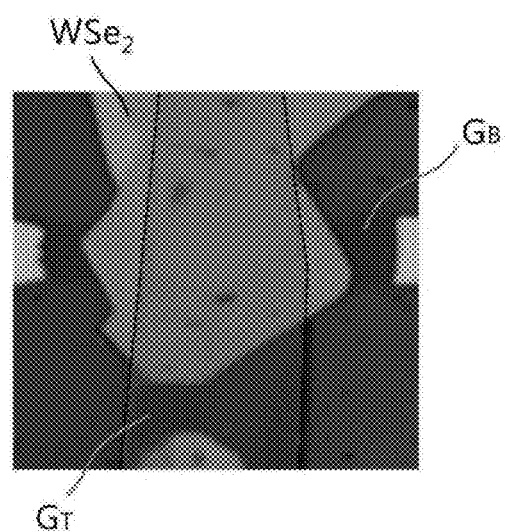
FIG. 23 is an optical microscope photograph of an optoelectronic device according to an example embodiment.

FIG. 23 is an optical microscope photograph of an optoelectronic device according to an example embodiment. The optoelectronic device of FIG. 23 has a stacked structure of a lower graphene layer GB, a $WSe_2$ layer, and an upper graphene layer GT, and has a planar structure that is similar to or same as the planar structure of the optoelectronic device of FIG. 21. The lower graphene layer GB is a layer doped with a p-type dopant, and the $WSe_2$ layer is a 2D semiconductor layer.

Figure 24:
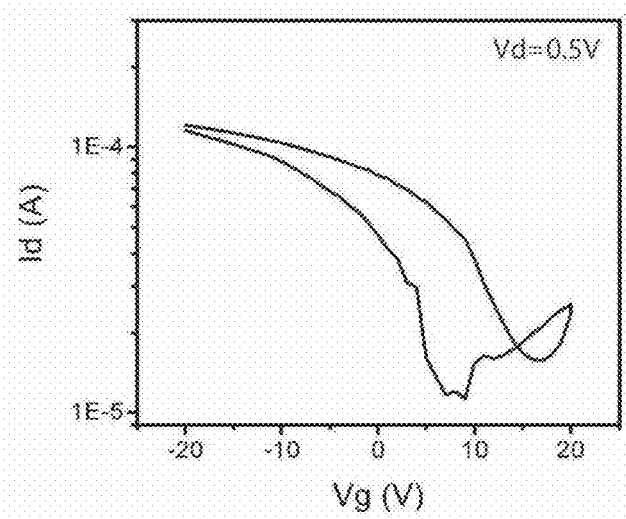
FIG. 24 is a graph showing a result of evaluating the gate voltage-drain current (Vg-Id) characteristics of the optoelectronic device of FIG. 23.

FIG. 24 is a graph showing a result of evaluating the gate voltage-drain current (Vg-Id) characteristics of the optoelectronic device of FIG. 23. To perform this evaluation, a gate electrode was disposed under the lower graphene layer GB of the optoelectronic device of FIG. 23, the lower graphene layer GB was used as a drain electrode, and the upper graphene layer GT was used as a source electrode.

Referring to FIG. 24, a minimum value point of the drain current Id is positioned in the graph at a voltage greater than 0V, namely, at a positive voltage. This result denotes that the lower graphene layer GB is p-doped.

Figure 25:
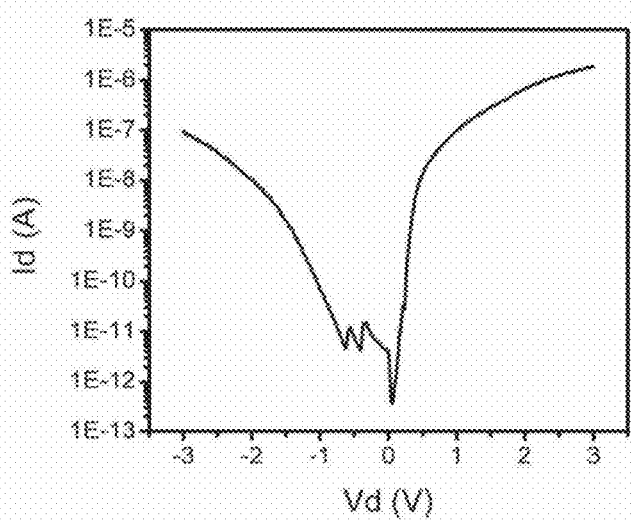
FIG. 25 is a graph showing a result of evaluating the drain voltage-drain current (Vd-Id) characteristics of the optoelectronic device of FIG. 23.

FIG. 25 is a graph showing a result of evaluating the drain voltage-drain current (Vd-Id) characteristics of the optoelectronic device of FIG. 23. To perform this evaluation, the lower graphene layer GB was used as a drain electrode, and the upper graphene layer GT was used as a source electrode. A gate voltage Vg was 0V.

Referring to FIG. 25, a current-voltage (IV) curve is horizontally asymmetrical about a location in the graph where the drain voltage Vd is about 0 V. For example, when the drain voltage Vd is −1 V, the drain current Id is about $10^{-10}$ A, and, when the drain voltage Vd is +1 V, the drain current Id is about $10^{-7}$ A. A difference between drain currents Id when the drain voltage Vd is −1V and when the drain voltage Vd is +1V is greater than about $10^3$ A. This horizontal asymmetry denotes that a built-in potential has been formed in a semiconductor layer (i.e., the $WSe_2$ layer) between the lower graphene layer GB and the upper graphene layer GT.

Figure 26:
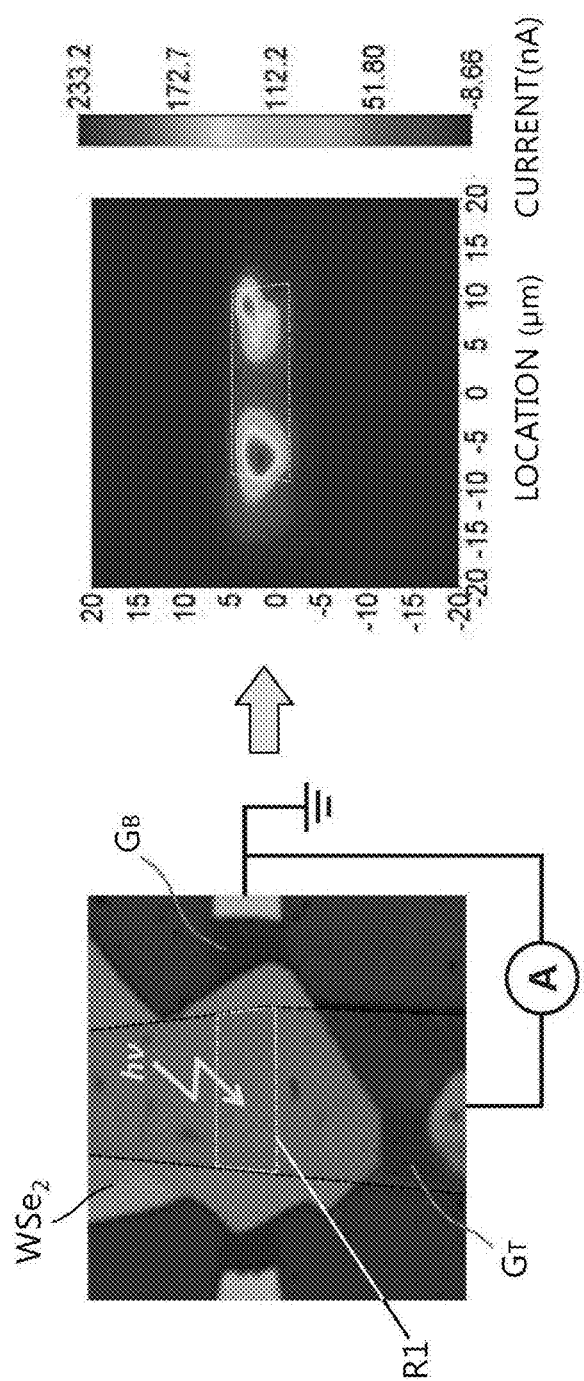
FIG. 26 shows a result of evaluating a photoconductive property of an optoelectronic device according to an example embodiment.

FIG. 26 shows a result of evaluating a photoconductive property of an optoelectronic device according to an example embodiment. The left drawing of FIG. 26 schematically shows a method of evaluating the optoelectronic device, and the right drawing thereof shows a result of the evaluation. The optoelectronic device (left drawing) of FIG. 26 was the same as the optoelectronic device of FIG. 23. When no voltages were applied to first and second electrodes (i.e., the lower and upper graphene layers GB and GT) of the optoelectronic device, namely, in a zero-bias state, the amount of generated current was measured while radiating light to an active region R1 of the semiconductor layer (i.e., the WSe$_2$ layer) by using a light source. An image as shown in the right drawing of FIG. 26 may be obtained via photocurrent mapping. A wavelength of light generated by the light source was 641 nm, and power of the light source was 3.1 μW/μm$^2$. Reference character A in the left drawing of FIG. 26 denotes an amp-meter.

Referring to the right drawing of FIG. 26, a relatively large amount of current was generated in a region corresponding to the active region R1 of the semiconductor layer (i.e., the WSe$_2$ layer). When photo-responsivity is calculated from this result (i.e., 233 nA/3.1 μW), the photo-responsivity is about 75 mA/W. Referring to the evaluation result of FIG. 26, the optoelectronic device according to an example embodiment exhibits a photoconductive property even in the zero bias state where no external voltage is applied.

The idea according to an example embodiment is applicable to not only optoelectronic devices but also to other semiconductor devices such as transistors. Since a transistor is able to use three electrodes (i.e., a source electrode, a drain electrode, and a gate electrode), the transistor may be referred to as a 3-terminal device. Thus, a transistor according to an example embodiment may have a structure in which a third electrode (i.e., a gate electrode) is added to one of the structures of FIG. 3 and FIGS. 14-19.

Figure 27:
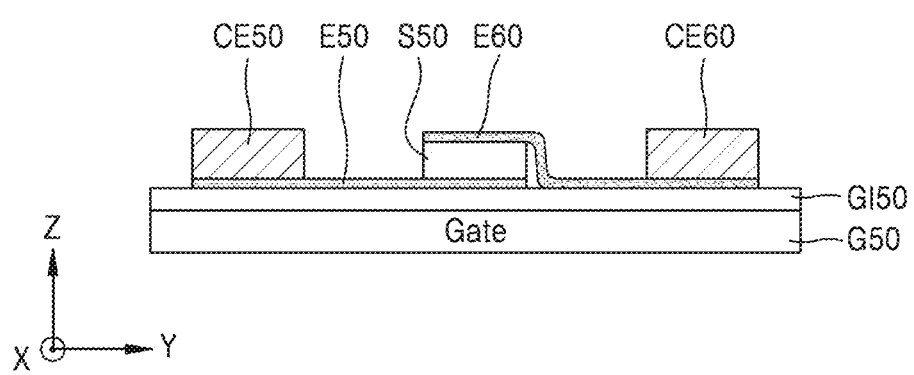
FIG. 27 is a cross-sectional view of a transistor according to an example embodiment.

FIG. 27 is a cross-sectional view of a transistor according to an example embodiment.

Referring to FIG. 27, similar to or the same as the structure of FIG. 3, a first electrode E50, a second electrode E60, a semiconductor layer S50, a first contact electrode CE50, and a second contact electrode CE60 may be included. The first electrode E50, the second electrode E60, the semiconductor layer S50, the first contact electrode CE50, and the second contact electrode CE60 may be respectively the same as or similar to the first electrode E10, the second electrode E20, the semiconductor active layer S10, the first contact electrode CE10, and the second contact electrode CE20 of FIG. 3. According to the example embodiment of FIG. 3, the semiconductor active layer S10 may be used as a photoactive layer. According to an example embodiment (FIG. 27), the semiconductor layer S50 may be used as a channel layer. The transistor according to an example embodiment may further include a gate electrode G50 for applying an electric field to the semiconductor layer S50. The gate electrode G50 may be formed of or include a 2D conductor, such as graphene, or of a general conductor other than the 2D conductor. The gate electrode G50 may be transparent or may not be transparent. A gate insulation layer GI50 may be formed between the semiconductor layer S50 and the gate electrode G50. The gate insulation layer GI50 may be formed of or include a 2D insulator, such as h-BN, or of a general insulator other than the 2D insulator. The gate insulation layer GI50 may be formed on the gate electrode G50, and the first electrode E50, the second electrode E60, the semiconductor layer S50, the first contact electrode CE50, and the second contact electrode CE60 may be formed on the gate insulation layer GI50. One of the first and second electrodes E50 and E60 may be a source electrode, and the other may be a drain electrode. Accordingly, one of the first and second contact electrodes CE50 and CE60 may be a source contact electrode, and the other may be a drain contact electrode. For example, the first electrode E50 and the first contact electrode CE50 may be respectively a drain electrode and a drain contact electrode, and the second electrode E60 and the second contact electrode CE60 may be respectively a source electrode and a source contact electrode. The roles of the source electrode and the drain electrode may be switched over.

In the structure of FIG. 27, at least one of the first and second electrodes E50 and E60 may include a doped graphene layer. For example, one of the first electrode E10 and the second electrode E20 may include a graphene layer doped with a p-type dopant and the other may include a graphene layer doped with an n-type dopant. Alternatively, one of the first electrode E10 and the second electrode E20 may include a graphene layer doped with a p-type dopant or an n-type dopant, and the other of the first electrode E10 and the second electrode E20 may include a metallic material layer. In this case, a difference between the work functions of the doped graphene layer and the metallic material layer may be, for example, about 0.1 eV to about 5 eV or about 0.3 eV to about 3 eV.

The semiconductor layer S50 may include a 2D semiconductor and/or a quantum dot. Detailed matters of the 2D semiconductor and the quantum dot may be the same as described above, and thus repeated descriptions thereof will be omitted. In some cases, the semiconductor layer S50 may include at least one of various semiconductor materials, such as a Group IV-based semiconductor including Si, Ge, or SiGe, a Group III-IV semiconductor, an oxide semiconductor, a nitride semiconductor, and an oxynitride semiconductor. The semiconductor layer S50 may have a built-in potential of about 0.1 eV or greater, or of about 0.3 eV or greater. The built-in potential may be about 0.1 eV to about 5 eV, for example, about 0.3 eV to about 3 eV. The semiconductor layer S50 may have a built-in electric field of about 0.3 MV/cm or greater, or about 1 MV/cm or greater. The built-in electric field may be about 0.3 MV/cm to about 100 MV/cm, for example, about 1 MV/cm to about 70 MV/cm.

The semiconductor layer S50 may be used as a tunneling layer. In other words, due to tunneling of a charge (electron/hole) via the semiconductor layer S50, current may flow between the first electrode E50 and the second electrode E60. In this case, the transistor according to an example embodiment may be referred to as a tunneling transistor. According to a voltage applied to the gate electrode G50, it may be determined whether the semiconductor layer S50 is activated, namely, is turned on or off. According to an example embodiment, since the semiconductor layer S50 has the built-in potential and/or the built-in electric field, tunneling of a charge via the semiconductor layer S50 may easily occur. In other words, tunneling efficiency may be increased by the built-in potential and/or the built-in electric field. Therefore, according to an example embodiment, a tunneling transistor having excellent performance may be realized.

In addition, the semiconductor layer S50 may include a first region adjacent to the first electrode E50 and a second region adjacent to the second electrode E60, and at least one of the first and second regions may be a doped region. In other words, the semiconductor layer S50 may have a structure that is the same as or similar to the structure of each of the semiconductor active layers S10a-S10d of FIGS. 9-12. Accordingly, the first region of the semiconductor layer S50 may be doped with a dopant of the same type as that of the dopant of the first electrode E50, and/or the second region of the semiconductor layer S50 may be doped with a dopant of the same type as that of the dopant of the second electrode E60. As at least one of the first and second regions of the semiconductor layer S50 is doped as described above, tunneling characteristics of the semiconductor layer S50, for example, may more improve, and consequently, performance of the transistor may improve.

FIG. 28 is an energy band diagram of the transistor of FIG. 27 when the transistor is in an equilibrium state.

Referring to FIG. 28, the first electrode E50 may be a graphene layer doped with a p-type dopant (i.e., a p-doped graphene layer), and the second electrode E60 may be a graphene layer doped with an n-type dopant (i.e., an n-doped graphene layer). As shown in FIG. 28, an energy band of the semiconductor layer S50 may have an inclined structure. The semiconductor layer S50 may have a built-in potential of about 0.1 eV or greater or about 0.3 eV or greater. The semiconductor layer S50 may have a built-in electric field of about 0.3 MV/cm or greater, or of about 1 MV/cm or greater. Due to the semiconductor layer S50 having a built-in potential and/or a built-in electric field, tunneling characteristics of the semiconductor layer S50 may improve, and performance of the transistor may improve.

Methods of manufacturing a semiconductor device (e.g., an optoelectronic device or a transistor), according to example embodiments, will now be described.

FIGS. 29A through 29F are cross-sectional views for explaining a method of manufacturing a semiconductor device, according to an example embodiment.

Figure 29A:
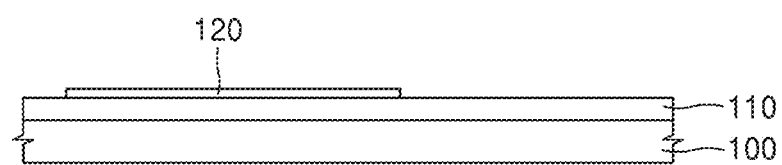
FIGS. 29A through 29F are cross-sectional views for explaining a method of manufacturing a semiconductor device, according to an example embodiment.

Referring to FIG. 29A, an insulation layer 110 may be formed on a substrate 100. The substrate 100 may be, for example, a semiconductor substrate such as a silicon substrate, but may be any of other substrates. The material used to form the substrate 100 may be an insulator or a conductor. The substrate 100 may be a flexible substrate or a rigid substrate, and may be a transparent, opaque, or semi-transparent substrate. The insulation layer 110 may be, for example, a silicon oxide layer. When a silicon substrate is used as the substrate 100, a silicon oxide layer may be formed by oxidizing a surface portion of the silicon substrate, and the silicon oxide layer may be used as the insulation layer 110. The material used to form the insulation layer 110 may vary. In some cases, the insulation layer 110 may not be formed.

Then, a first electrode 120 may be formed on the insulation layer 110. The first electrode 120 may be formed of or include, for example, a graphene layer. In this case, the first electrode 120 may be referred to as a first graphene layer. The first graphene layer may be formed via a general transfer process. Alternatively, the first graphene layer may be directly grown on the substrate 100.

Figure 29B:
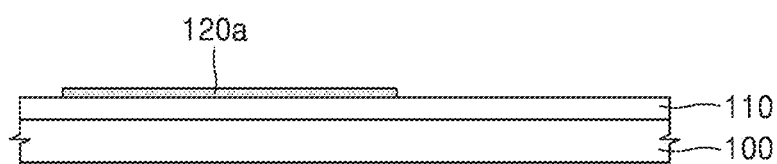

Referring to FIG. 29B, the first electrode 120 may be doped with of a dopant of a first type. Consequently, a doped first electrode 120a may be obtained. For example, the doped first electrode 120a may be obtained by doping the first electrode 120 with a p-type dopant. The doped first electrode 120a may be a p-doped graphene layer.

An example method of doping the first electrode 120, namely, a method of forming the doped first electrode 120a, will now be described in more detail. When the first electrode 120 is a graphene layer, the first electrode 120 may be doped via a plasma doping process or a chemical doping process. When the first electrode 120 is p-doped via chemical doping, $AuCl_3$, $FeCl_3$, An-Br, or TPA, for example, may be used as a source of a p-type dopant. Here, An-Br is 9,10-Dibromo-anthracene, and TPA is tetrasodium 1,3,6,8-pyrenetetrasulfonic acid. Also, diazonium-salt may be used as a source of the p-type dopant, and the diazonium-salt may include, for example, 4-BBDT. Au in $AuCl_3$ may serve as the p-type dopant, and a bromine group in diazonium-salt may serve as the p-type dopant. The source of the p-type dopant may be an ionic liquid, such as $NO_2BF_4$, $NOBF_4$, or $NO_2SbF_6$, an acidic compound, such as HCl, $H_3PO_4$, $CH_3COOH$, $H_2SO_4$, or $HNO_3$, or an organic compound, such as dichlorodicyanoquinone (DDQ), oxone, dimyristoylphosphatidylinositol (DMPI), or trifluoromethanesulfoneimide. Alternatively, the source of the p-type dopant may be $HPtCl_4$, $HAuCl_4$, AgOTf, $AgNO_3$, $H_2PdCl_6$, $Pd(OAc)_2$, $Cu(CN)_2$, or the like. However, the materials (sources) of the p-type dopant stated above are merely examples, and any of various other materials may be used.

Figure 29C:
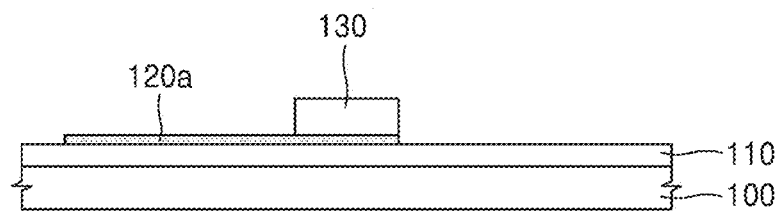

Referring to FIG. 29C, a semiconductor layer 130 may be formed on the doped first electrode 120a. The semiconductor layer 130 may be formed of or include a 2D semiconductor having a 2D crystal structure or formed of or include a quantum dot. Alternatively, the semiconductor layer 130 may be formed to include both the 2D semiconductor and the quantum dot. In some cases, the semiconductor layer 130 may be formed to include at least one of various semiconductor materials, such as a Group IV-based semiconductor including Si, Ge, or SiGe, a Group III-IV semiconductor, an oxide semiconductor, a nitride semiconductor, and an oxynitride semiconductor. The semiconductor layer 130 may be formed on a desired, or alternatively predetermined region, for example, one end, of the doped first electrode 120a, and the remaining region of the doped first electrode 120a may be exposed without being covered by the semiconductor layer 130.

Figure 29D:
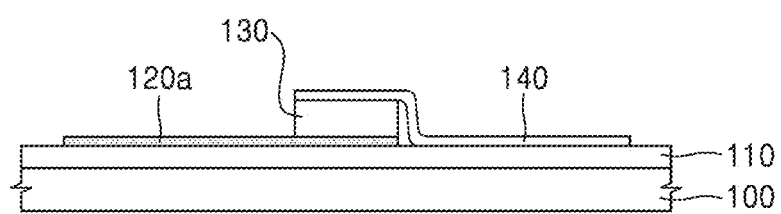

Referring to FIG. 29D, a second electrode 140 may be formed on the semiconductor 130. The second electrode 140 may be formed of or include, for example, a graphene layer. In this case, the second electrode 140 may be referred to as a second graphene layer. The second electrode 140 may extend toward one side of the semiconductor layer 130 while covering an upper surface of the semiconductor layer 130. Thus, the second electrode 140 may extend over the insulation layer 110 on the one side of the semiconductor layer 130.

Figure 29E:
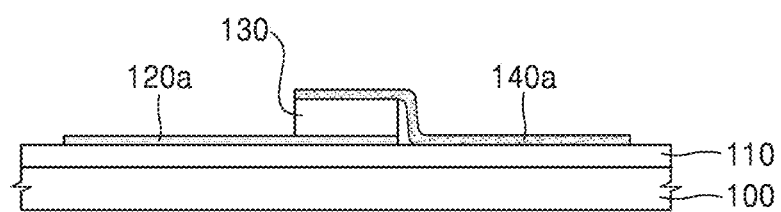

Referring to FIG. 29E, a doping process may be performed on the second electrode 140. For example, a doped second electrode 140a may be obtained by doping the second electrode 140 with a second type of dopant. The second type dopant may be, for example, an n-type dopant. In this case, the doped second electrode 140a may be an n-doped graphene layer.

A method of doping the second electrode 140, namely, a method of forming the doped second electrode 140a, will now be described in more detail. When the second electrode 140 is a graphene layer, the second electrode 140 may be doped via a plasma doping process or a chemical doping process. When plasma is used, an n-doped graphene layer (i.e., the doped second electrode 140a) may be obtained by replacing a portion of carbon (C) in the graphene layer (i.e., the second electrode 140) with nitrogen (N) by using, for example, N plasma. To n-dope the second electrode 140 via chemical doping, "aromatic molecules with electron-donor groups" or ammonium fluoride, for example, may be used as a source of the n-type dopant. Here, "aromatic molecules with electron-donor groups" may be, for example, 9,10-Dimethylanthracene ($An-CH_3$) or 1,5-Naphthalenediamine ($Na-NH_2$). The source of the n-type dopant may be a compound including nicotinamide, a reduction product of a substituted or unsubstituted nicotinamide, a reduction product of a compound which is chemically bound to a substituted or unsubstituted nicotinamide, or a compound comprising at least two pyridinium moieties in which a nitrogen atom of at least one of the pyridinium moieties is reduced. For example, the source of the n-type dopant may include nicotinamide mononucleotide (NMN), nicotinamide adenine dinucleotide (NAD), nicotinamide adenine dinucleotide phosphate (NADP), nicotinamide mononucleotide-H (NMNH), nicotinamide adenine dinucleotide-H (NADH), or nicotinamide adenine dinucleotide phosphate-H (NADPH) or may include viologen. The viologen may include, for example, at least one of 1,1'dibenzyl-4,4'-bipyridinium dichloride, methyl viologen dichloride hydrate, ethyl viologen diperchlorate, 1,1'dioctadecyl-4,4'-bipyridinium dibromide, and di-octyl bis(4-pyridyl)biphenyl viologen. The viologen may further include a molecular structure capable of conjugation between two pyridine structures. In this case, the molecular structure may include aryl, alkenyl, alkynyl, or the like. Alternatively, the source of the n-type dopant may include a polymer, such as polyetherimide (PEI). Nitrogen atoms in the viologen may serve as an n-type dopant, and an amine group in PEI may serve as an n-type dopant. Alternatively, the n-type dopant may include an alkali metal, such as K or Li. However, the materials (sources) of the p-type dopant stated above are merely examples, and any of various other materials may be used.

In operation of FIG. 29E, a portion of the first electrode 120a that is exposed without being covered by the semiconductor layer 130 may be exposed to doping of the n-type dopant. Thus, the exposed portion of the first electrode 120a, which is outside the semiconductor layer 130, may be doped with the n-type dopant. However, the exposed portion may be a region that does not affect or seldom affects the semiconductor layer 130. A portion of the first electrode 120a that exists directly below the semiconductor layer 130 may directly affect the semiconductor layer 130. The portion may not be exposed to the n-type dopant in the operation of FIG. 29E. Thus, a concentration of a first dopant (e.g., a p-type dopant) of the portion of the first electrode 120a directly below the semiconductor layer 130 may be different from the concentration of the first dopant (e.g., a p-type dopant) of the exposed portion of the first electrode 120a that is not covered by the semiconductor layer 130. However, when a mask (not shown) covering the doped first electrode 120a is formed and doping is then performed on the second electrode 140 in operations of FIGS. 29D and 29E, substantially the entire doped first electrode 120a may not be affected by the doping with respect to the second electrode 140. In this case, a concentration of the first dopant (e.g., the p-type dopant) in substantially the entire region of the doped first electrode 120a may be uniform or substantially uniform.

Figure 29F:
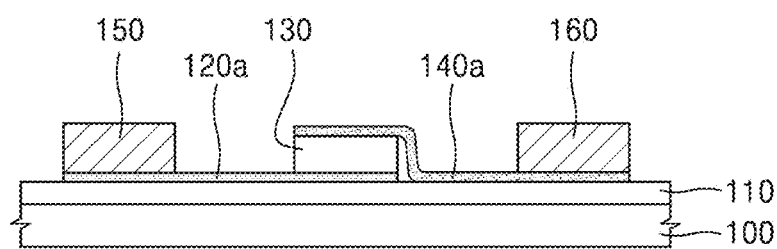

Referring to FIG. 29F, a first contact electrode 150 may be formed on the doped first electrode 120a, and a second contact electrode 160 may be formed on the doped second electrode 140a. The first contact electrode 150 and the second contact electrode 160 may be formed of or include the same material or different materials. The doped first electrode 120a, the semiconductor layer 130, the second electrode 140a, the first contact electrode 150, and the second contact electrode 160 may respectively correspond to the first electrode E10, the semiconductor active layer S10, the second electrode E20, the first contact electrode CE10, and the second contact electrode CE20 of FIG. 3. Alternatively, the doped first electrode 120a, the semiconductor active layer 130, the second electrode 140a, the first contact electrode 150, and the second contact electrode 160 may respectively correspond to the first electrode E50, the semiconductor layer S50, the second electrode E60, the first contact electrode CE50, and the second contact electrode CE60 of FIG. 27. In this case, the substrate 100 and the insulation 110 may respectively correspond to the gate electrode G50 and the gate insulation layer GI50 of FIG. 27.

Although the doped first electrode 120a is a p-doped graphene layer and the doped second electrode 140a is an n-doped graphene layer in the example embodiment of FIGS. 29A-29F, the doped first electrode 120a may be an n-doped graphene layer and the doped second electrode 140a may be a p-doped graphene layer. According to another example embodiment, one of the doped first and second electrodes 120a and 140a may be formed of or include a p-doped graphene layer or an n-doped graphene layer, and the other may be formed of or include a metallic material layer. In this case, a difference between the work functions of the n-doped or p-doped graphene layer and the metallic material layer may be about 0.1 to about 5 eV. In some cases, one of the doped first and second electrodes 120a and 140a may be formed of or include a p-doped graphene layer or an n-doped graphene layer, and the other may be formed of or include an undoped graphene layer.

According to another example embodiment, at least a portion of the semiconductor layer 130 may be doped. The structures of the semiconductor layers S10a-S10d described above with reference to FIGS. 9-12 may be formed by doping at least a portion of the semiconductor layer 130. A method of forming the semiconductor layers S10a-S10d described above with reference to FIGS. 9-12 will now be described with reference to FIGS. 30A-30E and FIGS. 31A-31D.

FIGS. 30A through 30E are cross-sectional views for explaining a method of doping at least a portion of a semiconductor layer that is applicable to a semiconductor device (e.g., an optoelectronic device or a transistor), according to an example embodiment.

Figure 30A:
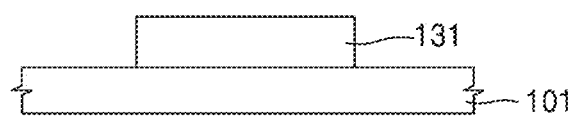
FIGS. 30A through 30E are cross-sectional views for explaining a method of doping at least a portion of a semiconductor layer that is applicable to a semiconductor device, according to an example embodiment.

Referring to FIG. 30A, a semiconductor layer 131 may be formed on a first substrate 101.

Figure 30B:
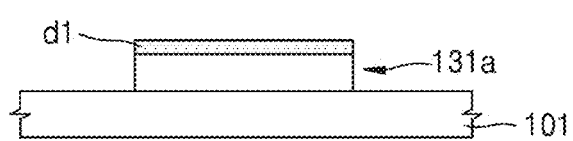

Referring to FIG. 30B, a first doped region d1 may be formed by doping at least a portion of an upper surface portion of the semiconductor layer 131 with a first type dopant. Reference numeral 131a indicates a semiconductor layer including the first doped region d1. The first type dopant may be, for example, a p-type dopant. In this case, the first doped region d1 may be a p-type doped region.

Figure 30C:
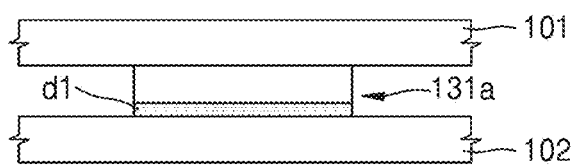
Figure 30D:
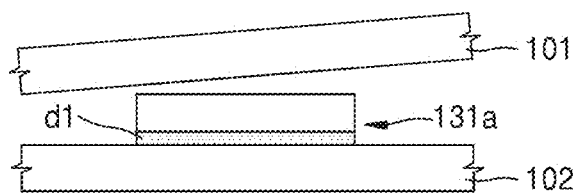

Referring to FIGS. 30C and 30D, the semiconductor layer 131a formed on in the first substrate 101 may be transferred to a second substrate 102. In this case, the first doped region d1 may be attached to an upper surface of the second substrate 102. In other words, the semiconductor layer 131a may be turned upside down and then transferred to the second substrate 102. Accordingly, an upper surface portion of the semiconductor layer 131a formed on the second substrate 102 may be in an undoped state.

Figure 30E:
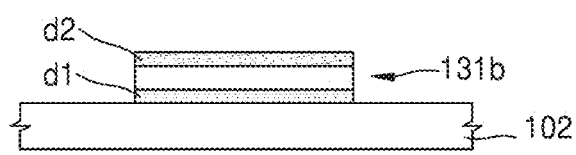

Referring to FIG. 30E, a second doped region d2 may be formed by doping a portion of the upper surface portion of the semiconductor layer 131a with a second type dopant. Reference numeral 131b indicates a semiconductor layer including the first doped region d1 and the second doped region d2. The second type dopant may be, for example, an n-type dopant. In this case, the second doped region d2 may be an n-type doped region.

The second substrate 102 used in operations of FIGS. 30C-30E may be, for example, a structure of FIG. 29B, namely, a structure including the substrate 100, the insulation layer 110, and the doped first electrode 120a. The processes of FIGS. 30C-30E may be performed by using the structure of FIG. 29B as the second substrate 102. Accordingly, the semiconductor layer 131b of FIG. 30E may be formed on the doped first electrode 120a of FIG. 29B.

The first and second doped regions d1 and d2 in operations of FIGS. 30C-30E may be formed via plasma doping or chemical doping. For example, the first doped region d1 doped with a p-type dopant may be formed by processing an upper surface portion (exposed portion) of the semiconductor layer 131 in the structure of FIG. 30A by using a NOx-containing solution. This process may be referred to as NOx chemisorption, and may be performed at, for example, about 150° C. When the semiconductor layer 131 is formed of or include $MoS_2$, the semiconductor layer 131 may be p-doped by replacing S with NOx. By dipping the semiconductor layer 131a in the structure of FIG. 30D within a $Cl_2$- or Cl-containing solution, the second doped region d2 doped with an n-type dopant may be formed on the upper surface portion (exposed portion) of the semiconductor layer 131a. When the semiconductor layer 131a is formed of or include $MoS_2$, the semiconductor layer 131a may be n-doped by replacing S with Cl. The materials (sources) of a p-type dopant and an n-type dopant used to form the first and second doped regions d1 and d2 on the semiconductor layer 131 may be the same as or similar to the materials and properties of a p-type dopant and an n-type dopant for doping a graphene layer. In some cases, at least of the first and second doped regions d1 and d2 may be formed via ion implantation.

FIGS. 31A through 31D are cross-sectional views for explaining a method of doping at least a portion of a semiconductor layer that is applicable to a semiconductor device (e.g., an optoelectronic device or a transistor), according to another example embodiment.

Figure 31A:
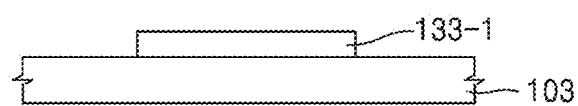
FIGS. 31A through 31D are cross-sectional views for explaining a method of doping at least a portion of a semiconductor layer that is applicable to a semiconductor device, according to another example embodiment.

Referring to FIG. 31A, a first semiconductor layer 133-1 may be formed on a substrate 103. The first semiconductor layer 133-1 may be formed of or include at least one of a 2D semiconductor and a quantum dot. Alternatively, the first semiconductor layer 133-1 may be formed to include at least one of various semiconductor materials, such as a Group IV-based semiconductor, including Si, Ge, or SiGe, a Group III-IV semiconductor, an oxide semiconductor, a nitride semiconductor, and an oxynitride semiconductor.

Figure 31B:

Referring to FIG. 31B, the first semiconductor layer 133-1 may be doped with of a first type dopant. The first type dopant may be, for example, a p-type dopant. In this case, a p-doped first semiconductor layer 133-1a may be formed.

Figure 31C:
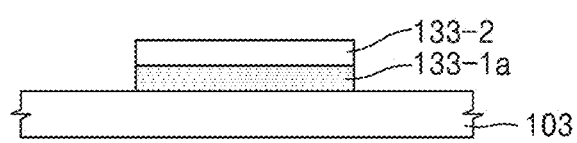

Referring to FIG. 31C, a second semiconductor layer 133-2 may be formed on the p-doped first semiconductor layer 133-1a. The second semiconductor layer 133-2 may be formed of or include a material that is the same as or different from the material used to form the first semiconductor layer 133-1 of FIG. 31A.

Figure 31D:
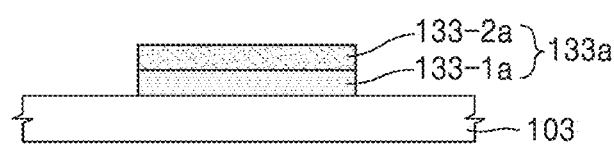

Referring to FIG. 31D, the second semiconductor layer 133-2 may be doped with of a second type dopant. The second type dopant may be, for example, an n-type dopant. In this case, an n-doped second semiconductor layer 133-2a may be formed. The two doped semiconductor layers 133-1a and 133-2a constitute a semiconductor layer 133a. The semiconductor layer 133a may have a multi-layered structure, for example, a double-layered structure. A lower layer region of the semiconductor layer 133a may be doped with a first type dopant and an upper layer region thereof may be doped with a second type dopant.

The substrate 103 used in the example embodiment of FIGS. 31A-31D may be, for example, the structure of FIG. 29B, namely, the structure including the substrate 100, the insulation layer 110, and the doped first electrode 120a. The processes of FIGS. 31A-31D may be performed using the structure of FIG. 29B as the substrate 103. Accordingly, the semiconductor layer 133a of FIG. 31D may be formed on the doped first electrode 120a of FIG. 29B.

When the method of FIGS. 30A through 30E or the method of FIGS. 31A through 31D is changed, the structure of the semiconductor layer S10c or S10d of FIG. 11 or 12 may be formed. This is well known to one of ordinary skill in the art to which the example embodiments pertain, and thus a detailed description thereof will be omitted here.

FIGS. 32A through 32G are cross-sectional views for explaining a method of manufacturing a semiconductor device, according to another example embodiment. The example embodiment illustrates a method of manufacturing a semiconductor device (optoelectronic device) as shown in FIG. 19.

Figure 32A:
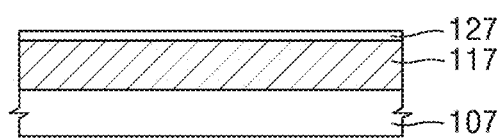
FIGS. 32A through 32G are cross-sectional views for explaining a method of manufacturing a semiconductor device, according to another example embodiment.

Referring to FIG. 32A, a first contact electrode 117 may be formed on a substrate 107. The first contact electrode 117 may be transparent or may not be transparent. A first electrode 127 may be formed on the first contact electrode 117. The first electrode 127 may be formed of or include, for example, a graphene layer. In this case, the first electrode 127 may be referred to as a first graphene layer. When the first electrode 127 is formed of or include a graphene layer, the graphene layer may be formed using the first contact electrode 117 as a catalyst.

Figure 32B:
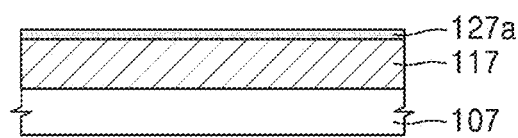

Referring to FIG. 32B, a doped first electrode 127a may be obtained by doping the first electrode 127 with a first type dopant. The first type dopant may be, for example, a p-type dopant. In this case, the doped first electrode 127a may be a p-doped graphene layer. A method of doping the first electrode 127 may be the same as or similar to the method of doping the first electrode 120 described above with reference to FIGS. 29A and 29B. Additionally, according to an example embodiment, when a graphene layer which is to be used as the first electrode 127 is formed using the first contact electrode 117 as a catalyst (metal catalyst), the graphene layer may be doped by the catalyst. According to the material of the catalyst, a graphene layer that is grown on the catalyst may be p-doped or n-doped. For example, a graphene layer is grown on a Ni layer by using the Ni layer as a catalyst, the graphene layer may be n-doped by the Ni layer. When the first contact electrode 117 is used as a catalyst, Au, Co, Cu, Fe, Ir, Mo, Ni, Pd, Pt, Rh, Ru, or the like may be used as a material used to form the first contact electrode 117, namely, as a catalyst material. A doped graphene layer may be grown using the catalyst material, and, when the doped graphene layer is used as the doped first electrode 127a, no special doping processes may be performed.

Figure 32C:
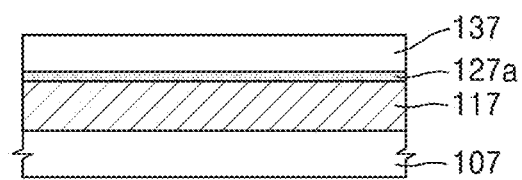

Referring to FIG. 32C, a semiconductor layer 137 may be formed on the doped first electrode 127a. The semiconductor layer 137 may be formed of or include a 2D semiconductor, a quantum dot, or a general semiconductor material.

Figure 32D:
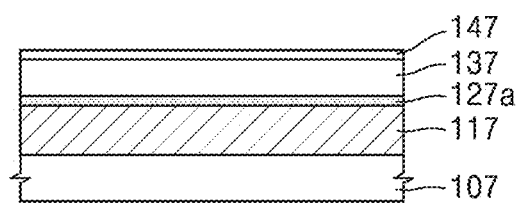

Referring to FIG. 32D, a second electrode 147 may be formed on the semiconductor 137. The second electrode 147 may be formed of or include, for example, a graphene layer. In this case, the second electrode 147 may be referred to as a second graphene layer.

Figure 32E:
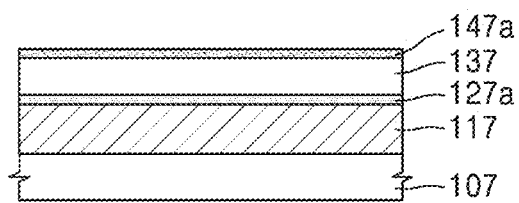

Referring to FIG. 32E, a doped second electrode 147a may be obtained by doping the second electrode 147 with a second type dopant. The second type dopant may be, for example, an n-type dopant. In this case, the doped second electrode 147a may be an n-doped graphene layer. A method of doping the second electrode 147 may be the same as or similar to the method of doping the second electrode 140 described above with reference to FIGS. 29D and 29E.

Figure 32F:
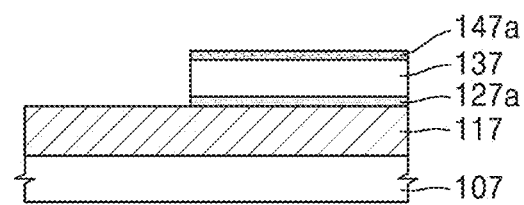

Referring to FIG. 32F, a portion of the first contact electrode 117 may be exposed by patterning the doped second electrode 147a, the semiconductor layer 137, and the doped first electrode 127a.

Figure 32G:
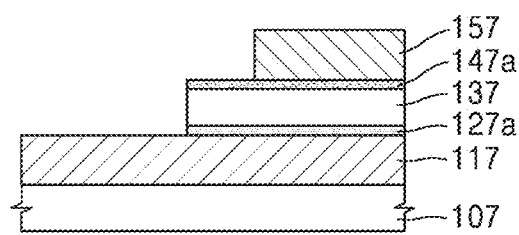

Referring to FIG. 32G, a second contact electrode 157 may be formed on the doped second electrode 147a. The second contact electrode 157 may be transparent or may not be transparent. The second contact electrode 157 may be formed to have a smaller size (width) than the doped second electrode 147a or to have the same size (width) as the doped second electrode 147a. In some cases, the first contact electrode 117, the doped first electrode 127a, the semiconductor layer 137, the doped second electrode 147a, and the second contact electrode 157 may be formed to have the same width.

Although the doped first electrode 127a is a p-doped graphene layer and the doped second electrode 147a is an n-doped graphene layer in the example embodiment of FIGS. 32A-32G, the doped first electrode 127a may be an n-doped graphene layer and the doped second electrode 147a may be a p-doped graphene layer. According to another example embodiment, one of the doped first and second electrodes 127a and 147a may be formed of or include a p-doped graphene layer or an n-doped graphene layer, and the other may be formed of or include a metallic material layer. In this case, a difference between the work functions of the n-doped or p-doped graphene layer and the metallic material layer may be about 0.1 eV to about 5 eV. In some cases, one of the doped first and second electrodes 127a and 147a may be formed of or include a p-doped graphene layer or an n-doped graphene layer, and the other may be formed of or include an undoped graphene layer.

By applying the method of FIGS. 30A-30E, the method of FIGS. 31A-31D, or a modification of each of the two methods to the example embodiment of FIGS. 32A-32G, at least a portion of the semiconductor layer 137 may be doped. In other words, the semiconductor layer 137 may be formed to have one of the semiconductor active layers S10a-S10d of FIGS. 9-12.

When the structure of FIG. 32G is used as a light-receiving device and light enters the semiconductor layer 137 from above, the second contact electrode 157 may be a transparent electrode. In this case, the first contact electrode 117 and the substrate 107 may not be transparent. When light enters the semiconductor layer 137 from below the substrate 107, the substrate 107 and the first contact electrode 117 may be transparent and the second contact electrode 157 may not be transparent. All of the substrate 107 and the first and second contact electrodes 117 and 157 may be transparent, or the substrate 107 may not be included.

According to example methods as described above, various structures of semiconductor devices (e.g., optoelectronic devices or transistors) may be easily manufactured. An optoelectronic device according to an example embodiment may be, for example, a doped graphene-2D semiconductor based optoelectronic device. The optoelectronic device is applicable to complementary metal oxide semiconductor (CMOS) image sensors, charge coupled devices (CCDs), or photodetectors of health monitoring devices, for example. In particular, the optoelectronic device according to an example embodiment may be usefully applied to next-generation CMOS image sensors (CISs) that require characteristics, such as high sensitivity, broadband (UV to IR), and flexibility. The optoelectronic device according to an example embodiment may also be applied to devices combined with Si-based image sensors or new types of flexible devices. The optoelectronic device according to an example embodiment may also be applied to solar cells or, in some cases, may be applied to light emitting devices. A transistor (tunneling transistor) according to an example embodiment may be flexible and very thin and may have excellent performance, and thus may be usefully applied to various electronic apparatuses including flexible devices.

While example embodiments have been particularly shown and described, it should be understood that the example embodiments should be considered in a descriptive sense only and not for purposes of limitation. For example, it will be understood by one of ordinary skill in the art that various changes in form and details may be made in the structures of the semiconductor devices of FIGS. 1-4, FIGS. 7-22, and FIG. 27 without departing from the spirit and scope of the following claims. For example, a 2D material such as h-BN may be applied to the semiconductor layer S10 of FIG. 3. In this case, the h-BN may have at least one defect level within an energy band gap, and thus, may have same or similar characteristics to a semiconductor with respect to light. Moreover, in semiconductor devices according to example embodiments, a 2D conductor or any other material instead of graphene may be used. Additionally, various modifications may be made to the semiconductor device manufacturing methods of FIGS. 29A-29F, FIGS. 30A-30E, FIGS. 31A-31D, and FIGS. 32A-32G. Various ideas according to example embodiments may be applied to optoelectronic devices, transistors, or any other devices. Therefore, the current scope is defined not by the example embodiments described herein but by the appended claims.

It should be understood that the example embodiments described herein should be considered in a descriptive sense only and not for purposes of limitation. Descriptions of features within each example embodiment should typically be considered as available for other similar or same features in other example embodiments.

While the example embodiments have been particularly shown and described, it will be understood by those of ordinary skill in the art that various changes in form and details may be made therein without departing from the spirit and scope as defined by the following claims.

What is claimed is:

1. An optoelectronic device comprising:
   a first electrode;
   a second electrode; and
   a semiconductor active layer between the first and second electrodes, the semiconductor active layer being a photodetecting layer,
   wherein the semiconductor active layer has a built-in potential of substantially 0.1 eV or greater,
   wherein one of the first electrode and the second electrode includes graphene doped with a p-type dopant, and
   wherein another of the first electrode and the second electrode includes graphene doped with an n-type dopant.

2. The optoelectronic device of claim 1, wherein a built-in electric field of the semiconductor active layer is substantially 0.3 MV/cm to 100 MV/cm.

3. The optoelectronic device of claim 1, wherein
   the semiconductor active layer comprises a first region that is adjacent to the first electrode, and a second region that is adjacent to the second electrode, and
   at least one of the first region and the second region is a doped region.

4. The optoelectronic device of claim 3, wherein
   when the first electrode is doped with a dopant of a first type, the first region of the semiconductor active layer is doped with a dopant of the first type, and/or when the second electrode is doped with a dopant of a second type, the second region of the semiconductor active layer is doped with a dopant of the second type.

5. The optoelectronic device of claim 3, wherein the first and second regions of the semiconductor active layer are apart from each other or in contact with each other.

6. The optoelectronic device of claim 1, wherein the semiconductor active layer comprises a two-dimensional (2D) semiconductor having a 2D crystal structure.

7. The optoelectronic device of claim 6, wherein
the 2D semiconductor includes a metal chalcogenide-based material, and
the metal chalcogenide-based material includes a metal element including Mo, W, Nb, V, Ta, Ti, Zr, Hf, Tc, Re, Cu, Ga, In, Sn, Ge, and Pb, and a chalcogen element including S, Se, and Te.

8. The optoelectronic device of claim 1, wherein the semiconductor active layer comprises a quantum dot.

9. The optoelectronic device of claim 1, wherein at least one of the first electrode, the second electrode, and the semiconductor active layer comprises a 2D material.

10. The optoelectronic device of claim 1, wherein the built-in potential of the semiconductor active layer is less than or equal to substantially 5 eV.

11. The optoelectronic device of claim 1, wherein the optoelectronic device comprises a photodetector or a photovoltaic device.

12. An optoelectronic device comprising:
a first electrode;
a second electrode; and
a semiconductor active layer between the first and second electrodes, the semiconductor active layer being a photodetecting layer,
wherein the semiconductor active layer has a built-in potential of substantially 0.1 eV or greater,
wherein one of the first electrode and the second electrode includes graphene doped with a p-type dopant,
wherein another of the first electrode and the second electrode includes graphene doped with an n-type dopant, and
wherein the optoelectronic device comprises a photodetector, and the photodetector is a self-powered photodetector.

13. The optoelectronic device of claim 1, further comprising:
a first contact electrode in contact with the first electrode; and
a second contact electrode in contact with the second electrode.

14. The optoelectronic device of claim 13, wherein the first contact electrode and the second contact electrode are apart from each other in a horizontal direction.

15. The optoelectronic device of claim 13, wherein the first contact electrode and the second contact electrode are apart from each other in a vertical direction.

16. The optoelectronic device of claim 1, wherein
the first electrode extends from the semiconductor active layer in a first direction, and
the second electrode extends from the semiconductor active layer in a second direction opposite the first direction.

17. The optoelectronic device of claim 1, wherein
the first electrode extends from the semiconductor active layer in a first direction, and
the second electrode extends from the semiconductor active layer in a second direction perpendicular to the first direction.

18. The optoelectronic device of claim 1, wherein
the first electrode, the second electrode, and the semiconductor active layer constitute a unit cell,
the optoelectronic device includes a plurality of unit cells, and further includes a plurality of first contact electrodes respectively connected to first ends of the plurality of unit cells, and a second contact electrode commonly connected to second ends of the plurality of unit cells.

19. An optoelectronic device comprising:
a first electrode;
a second electrode; and
a semiconductor active layer interposed between the first and second electrodes and including at least one of a 2D semiconductor and a quantum dot, the semiconductor active layer being a photodetecting layer,
wherein the semiconductor active layer has a built-in potential of substantially 0.1 eV or greater between the first and second electrodes,
wherein one of the first electrode and the second electrode includes graphene doped with a p-type dopant, and
wherein another of the first electrode and the second electrode includes graphene doped with an n-type dopant.

20. The optoelectronic device of claim 19, wherein
the semiconductor active layer comprises a first region that is adjacent to the first electrode, and a second region that is adjacent to the second electrode, and
at least one of the first region and the second region is a doped region.

21. The optoelectronic device of claim 20, wherein
when the first electrode is doped with a dopant of a first type, the first region of the semiconductor active layer is doped with a dopant of the first type, and
when the second electrode is doped with a dopant of a second type, the second region of the semiconductor active layer is doped with a dopant of the second type.

22. The optoelectronic device of claim 19, wherein
the 2D semiconductor includes a metal chalcogenide-based material, and
the metal chalcogenide-based material includes a metal element from Mo, W, Nb, V, Ta, Ti, Zr, Hf, Tc, Re, Cu, Ga, In, Sn, Ge, and Pb, and a chalcogen element from S, Se, and Te.

23. An optoelectronic device comprising:
a first electrode;
a second electrode; and
a semiconductor active layer between the first and second electrodes, the semiconductor active layer being a photodetecting layer,
wherein at least one of the first electrode and the second electrode includes doped graphene,
wherein the semiconductor active layer has a built-in potential of substantially 0.1 eV or greater, and
wherein the semiconductor active layer comprises a two-dimensional (2D) semiconductor having a 2D crystal structure.

24. The optoelectronic device of claim 23, wherein
one of the first electrode and the second electrode includes graphene doped with a p-type dopant, and
another of the first electrode and the second electrode includes graphene doped with an n-type dopant.

25. The optoelectronic device of claim 23, wherein
one of the first electrode and the second electrode includes graphene doped with a p-type dopant or an n-type dopant, and another of the first electrode and the second electrode includes a metallic material.

* * * * *